(12) United States Patent
Burak et al.

(10) Patent No.: US 8,796,904 B2
(45) Date of Patent: Aug. 5, 2014

(54) BULK ACOUSTIC RESONATOR COMPRISING PIEZOELECTRIC LAYER AND INVERSE PIEZOELECTRIC LAYER

(75) Inventors: Dariusz Burak, Fort Collins, CO (US); Kevin J. Grannen, Thornton, CO (US); John D. Larson, III, Palo Alto, CA (US); Alexandre Shirakawa, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 138 days.

(21) Appl. No.: 13/286,051

(22) Filed: Oct. 31, 2011

(65) Prior Publication Data

US 2013/0106248 A1   May 2, 2013

(51) Int. Cl.
    *H01L 41/08*     (2006.01)
    *H03H 9/58*      (2006.01)

(52) U.S. Cl.
    CPC .................................. *H03H 9/587* (2013.01)
    USPC ........................... 310/320; 310/324

(58) Field of Classification Search
    USPC ................... 310/320, 321, 324, 358
    See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kohn |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |

(Continued)

FOREIGN PATENT DOCUMENTS

| | | |
|---|---|---|
| CN | 101170303 | 4/2008 |
| DE | 10160617 | 6/2003 |

(Continued)

OTHER PUBLICATIONS

"Co-pending U.S. Appl. No. 13/161,946, filed Jun. 16, 2011".

(Continued)

*Primary Examiner* — J. San Martin

(57) ABSTRACT

In a representative embodiment, a bulk acoustic wave (BAW) resonator, comprises: a first electrode disposed over a substrate; a first piezoelectric layer disposed over the first electrode, the first piezoelectric layer having a first c-axis oriented along a first direction; a second electrode disposed over the first piezoelectric layer; and a second piezoelectric layer disposed over the first electrode and adjacent to the first piezoelectric layer, wherein the second piezoelectric layer has a second c-axis oriented in a second direction that is substantially antiparallel to the first direction.

17 Claims, 12 Drawing Sheets

(56) References Cited

U.S. PATENT DOCUMENTS

| | | |
|---|---|---|
| 4,625,138 A | 11/1986 | Ballato |
| 4,633,285 A | 12/1986 | Hunsinger et al. |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,916,520 A | 4/1990 | Kurashima |
| 4,933,743 A | 6/1990 | Thomas et al. |
| 5,006,478 A | 4/1991 | Kobayashi et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,087,959 A | 2/1992 | Omori et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,698,928 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,817,446 A | 10/1998 | Lammert |
| 5,825,092 A | 10/1998 | Eelgado et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,099,700 A | 8/2000 | Lee |
| 6,107,721 A | 8/2000 | Lakin |
| 6,111,341 A | 8/2000 | Hirama |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk et al. |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |

(56) References Cited

U.S. PATENT DOCUMENTS

| | | | |
|---|---|---|---|
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,607,934 B2 | 8/2003 | Chang et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner et al. |
| 6,943,648 B2 | 9/2005 | Maiz et al. |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 * | 12/2005 | Aigner et al. | 333/187 |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 * | 8/2006 | Larson et al. | 310/324 |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,161,448 B2 | 1/2007 | Feng et al. |
| 7,170,215 B2 | 1/2007 | Namba et al. |
| 7,173,504 B2 | 2/2007 | Larson, III et al. |
| 7,187,254 B2 | 3/2007 | Su et al. |
| 7,199,683 B2 | 4/2007 | Thalhammer et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson, III et al. |
| 7,345,410 B2 | 3/2008 | Grannen et al. |
| 7,358,831 B2 | 4/2008 | Larson et al. |
| 7,367,095 B2 * | 5/2008 | Larson et al. | 29/25.35 |
| 7,368,857 B2 | 5/2008 | Tanaka |
| 7,369,013 B2 | 5/2008 | Fazzio et al. |
| 7,377,168 B2 | 5/2008 | Liu |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III et al. |
| 7,425,787 B2 | 9/2008 | Larson, III |
| 7,439,824 B2 | 10/2008 | Aigner |
| 7,463,118 B2 | 12/2008 | Jacobsen |
| 7,466,213 B2 | 12/2008 | Lobl et al. |
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,576,471 B1 | 8/2009 | Solal |
| 7,602,101 B2 | 10/2009 | Hara et al. |
| 7,619,493 B2 | 11/2009 | Uno et al. |
| 7,629,865 B2 | 12/2009 | Ruby |
| 7,642,693 B2 * | 1/2010 | Akiyama et al. | 310/311 |
| 7,655,963 B2 | 2/2010 | Sadaka et al. |
| 7,684,109 B2 | 3/2010 | Godshalk et al. |
| 7,768,364 B2 | 8/2010 | Hart et al. |
| 7,791,434 B2 | 9/2010 | Fazzio et al. |
| 7,795,781 B2 | 9/2010 | Barber et al. |
| 7,889,024 B2 | 2/2011 | Bradley et al. |
| 8,507,919 B2 | 8/2013 | Ishikura |
| 8,673,121 B2 | 3/2014 | Larson et al. |
| 2001/0026951 A1 | 10/2001 | Vergani et al. |

(56) References Cited

U.S. PATENT DOCUMENTS

| | | |
|---|---|---|
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0155574 A1* | 8/2003 | Doolittle ................. 257/77 |
| 2003/0179053 A1 | 9/2003 | Aigner et al. |
| 2003/0205948 A1 | 11/2003 | Lin et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0082626 A1 | 4/2005 | Leedy |
| 2005/0093396 A1 | 5/2005 | Larson, III et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng et al. |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson et al. |
| 2006/0103492 A1 | 5/2006 | Feng et al. |
| 2006/0119453 A1 | 6/2006 | Fattinger et al. |
| 2006/0121686 A1 | 6/2006 | Wei et al. |
| 2006/0125489 A1 | 6/2006 | Feucht et al. |
| 2006/0132262 A1 | 6/2006 | Fazzio et al. |
| 2006/0160353 A1 | 7/2006 | Gueneau de Mussy et al. |
| 2006/0164183 A1 | 7/2006 | Tikka et al. |
| 2006/0164186 A1 | 7/2006 | Stoemmer et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0080759 A1 | 4/2007 | Jamneala et al. |
| 2007/0085213 A1 | 4/2007 | Ahn et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2008/0055020 A1 | 3/2008 | Handtmann et al. |
| 2008/0143215 A1 | 6/2008 | Hara et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0127978 A1 | 5/2009 | Asai et al. |
| 2009/0153268 A1 | 6/2009 | Milson et al. |
| 2010/0013573 A1 | 1/2010 | Umeda |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzieri et al. |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0187949 A1 | 7/2010 | Pahl et al. |
| 2010/0260453 A1 | 10/2010 | Block |
| 2010/0327697 A1 | 12/2010 | Choy et al. |
| 2010/0327994 A1 | 12/2010 | Choy et al. |
| 2011/0092067 A1 | 4/2011 | Bonilla et al. |
| 2011/0121689 A1* | 5/2011 | Grannen et al. ............. 310/357 |
| 2011/0180391 A1 | 7/2011 | Larson et al. |
| 2011/0204997 A1 | 8/2011 | Elbrecht et al. |
| 2011/0266917 A1* | 11/2011 | Metzger et al. .......... 310/313 A |
| 2012/0218055 A1 | 8/2012 | Burak et al. |
| 2012/0218056 A1 | 8/2012 | Burak |
| 2012/0248941 A1 | 10/2012 | Shirakawa et al. |
| 2013/0003377 A1 | 1/2013 | Sakai et al. |
| 2013/0127300 A1 | 5/2013 | Umeda et al. |
| 2013/0221454 A1 | 8/2013 | Dunbar et al. |
| 2013/0334625 A1 | 12/2013 | Lin |

FOREIGN PATENT DOCUMENTS

| | | |
|---|---|---|
| DE | 10239317 | 3/2004 |
| EP | 231892 | 8/1987 |
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |

(56) References Cited

FOREIGN PATENT DOCUMENTS

| EP | 1528674 | 5/2005 |
|---|---|---|
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299593 | 3/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 62-109419 | 5/1987 |
| JP | 62-200813 | 9/1987 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 10173479 | 6/1998 |
| JP | 2000-31552 | 1/2000 |
| JP | 2000-0076295 | 3/2000 |
| JP | 2000-232334 | 8/2000 |
| JP | 2000-295065 | 10/2000 |
| JP | 2000-332568 | 11/2000 |
| JP | 2001-102901 | 4/2001 |
| JP | 2001-508630 | 6/2001 |
| JP | 2002217676 | 8/2002 |
| JP | 2003/017964 | 1/2003 |
| JP | 2003-17974 | 1/2003 |
| JP | 2003-505905 | 2/2003 |
| JP | 2003-505906 | 2/2003 |
| JP | 2003124779 | 4/2003 |
| JP | 2003-332872 | 11/2003 |
| JP | 2006-109472 | 4/2006 |
| JP | 2006-295924 | 10/2006 |
| JP | 2006-319796 | 11/2006 |
| JP | 2007-006501 | 1/2007 |
| JP | 2007-028669 | 2/2007 |
| JP | 2007-295306 | 11/2007 |
| KR | 2002-0050729 | 6/2002 |
| KR | 1020030048917 | 6/2003 |
| WO | WO-98/16957 | 4/1998 |
| WO | WO-98/38736 | 9/1998 |
| WO | WO-98/56049 | 12/1998 |
| WO | WO-99/37023 | 7/1999 |
| WO | WO-9937023 | 7/1999 |
| WO | WO-01/06646 | 1/2001 |
| WO | WO-01/06647 | 1/2001 |
| WO | WO-0199276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

Pensala, et al. "Spurious Resonance Suppression in Gigahertz-Range ZnO Thin-Film Bulk Acoustic Wave Resonators by the Boundary Frame Method: Modeling and Experiment," IEEE Transactions on Ultrasonics, Ferroelectrics, and Frequency Control, vol. 56, No. 8, Aug. 2009, p. 1731-1744.
Co-pending U.S. Appl. No. 13/074,094, filed Mar. 29, 2011.
Co-pending U.S. Appl. No. 13/036,489, filed Feb. 28, 2011.
Co-pending U.S. Appl. No. 13/101,376, filed May 5, 2011.
Co-pending U.S. Appl. No. 13/074,262, filed Mar. 29, 2011.
Co-pending U.S. Appl. No. 13/161,946, filed Jun. 16, 2011.
"A partial GB Search Report for" Application No. GB0522393.8 Jan. 9, 2006, 4 pages.
"A partial GB Search Report for Application No.", GB0525884.3 Feb. 2, 2006, 4 pgs.
"British Search Report Application No.", 0605222.9 Jul. 11, 2006.
"Co-pending U.S. Appl. No. 12/710,640, filed Feb. 23, 2010".
"Co-pending U.S. Appl. No. 12/710,640, filed on Feb. 23, 2010".
"Co-pending U.S. Appl. No. 13/074,094, filed on Mar. 29, 2011".
"Examination report corresponding to application No.", GB0605770.7 Aug. 25, 2006.
"Examination Report from UK for application", GB 0605971.1 Aug. 24, 2006.
"Search Report for Great Britain Patent Application", No. 0617742.2 Mar. 29, 2007.
"Search Report for Great Britain Patent Application", No. 0617742. 2, Dec. 13, 2006.
"Search Report from corresponding application", No. GB0605225.2 Jun. 26, 2006.
"Search report from corresponding application No.", GB0620152.9 Nov. 15, 2006.
"Search report from corresponding application No.", GB0620653.6 Nov. 17, 2006.
"Search report from corresponding application No.", GB0620655.1 Nov. 17, 2006.
"Search Report from corresponding application No.", GB0620657.7 Nov. 23, 2006.
"Search Report from corresponding application number", GB 0605779.8 Aug. 23, 2006.
"Search Report in the Great Britian Patent Application", No. 0619698.4 Nov. 30, 2006.
Akiyama, at al., "Enhancement of Piezoelectric Response in Scandium Aluminum Nitride Alloy Thin Films Prepared by Dual Reactive Cosputtering", *Adv. Mater* 2009, 593-596.
Al-Ahmad, M. et al., "Piezoelectric-Based Tunable Microstrip Shunt Resonator", *Proceedings of Asia-Pacific Microwave Conference* 2006.
Aoyama, Takayuki at al., "Diffusion of Boron, Phosphorous, Arsenic and Antimony in Thermally Grown SiliconDioxide", *Journal of The Electrochemical Society*, vol. 146, No. 5 1999, 1879-1883.
Auld, B. A., "Acoustic Resonators", *Acoustic Fields and Waves in Solids, Second Edition vol. II* 1990, 250-259.
Bauer, L. O. at al., "Properties of Silicon Implanted with Boron Ions through Thermal Silicon Dioxide", *Solid State Electronics*, vol. 16, No. 3 Mar. 1973, 289-300.
Bi, F.Z., "Bulk Acoustic Wave RF Technology", *IEEE Microwave Magazine*, vol.9 Issue 5. 2008, 65-80.
Chen, , "Fabrication and Characterization of ALN Thin Film Bulk Acoustic Wave Resonator", *Dissertation, University of Pittsburgh School of Engineering* 2006.
Choi, Sungjin et al., "Design of Half-Bridge Piezo-Transformer Converters in the AC Adapter Applications", *APEC 2005 IEEE* Mar. 2005, 244-248.
Coombs, Clyde F., "Electronic Instrument Handbook", *Second Edition, McGraw-Hill, Inc.* 1995, pp. 5.1 to 5.29.
C-S Lee, et al., "Copper-Airbridged Low-Noise GaAs PHEMT With Ti/WN$_x$/Ti Diffusion Barrier for High-Frequency", *IEEE Transactions on Electron Devices*, vol. 53, Issue: 8. 2006, 1753-1758.
Denisse, C.M.M. et al., "Plasma-Enhanced Growth and Composition of Silicon Oxynitride Films", *J. Appl. Phys.*, vol. 60, No. 7. Oct. 1, 1986, 2536-2542.
Fattinger, G. G. et al., "Coupled Bulk Acoustic Wave Resonator Filters: Key technology for single-to-balanced RF filters", 0-7803-8331-1/4/W20.00; *IEEE MTT-S Digest* 2004, 927-929.

(56) References Cited

OTHER PUBLICATIONS

Fattinger, G.G. et al., "Single-To-Balance Filters for Mobile Phones Using Coupled Resonator BAW Technology", *2004 IEEE Ultrasonics Symposium* Aug. 2004, 416-419.
Fattinger, G. B. et al., "Spurious Mode Suppression in Coupled Resonator Filters", *IEEE MTT-S International Microwave Symposium Digest* 2005, 409-412.
Gilbert, S. R., "An Ultra-Miniature, Low Cost Single Ended to Differential Filter for ISM Band Applications", *Micro. Symp. Digest, 2008 IEEE MTT-S* Jun. 2008, 839-842.
Grill, A. et al., "Ultralow-K Dielectrics Prepared by Plasma-Enhanced Chemical Vapor Deposition", *App. Phys., Lett*, vol. 79 2001, 803-805.
Hadimioglu, B. et al., ""Polymer Films as Acoustic Matching Layers".", 1990 *IEEE Ultrasonics Symposium Proceedings*, vol. 3 PP. [Previously submitted as "Polymer Files as Acoustic Matching Layers, 1990 IEEE Ultrasonics Symposium Proceeding. vol. 4 pp. 1227-1340, Dec. 1990". Considered by Examiner on Mar. 20, 2007 Dec. 1990, 1337-1340.
Hara, K., "Surface Treatment of Quartz Oscillator Plate by Ion Implantation", *Oyo Buturi*, vol. 47, No. 2 Feb. 1978, 145-146.
Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.
Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.
Jamneala, T. et al., "Coupled Resonator Filter with Single-Layer Acoustic Coupler", *IEEE Transaction on Ultrasonics, Ferroelectrics, and Frequency Control*, vol. 55 Oct. 2008, 2320-2326.
Jamneala, Tiberiu et al., "Ultra-Miniature Coupled Resonator Filter with Single-Layer Acoustic Coupler", *IEEE Transactions on Ultrasonics, Ferroelectrics, and Frequency Control*, vol. 56 No. 11. Nov. 2009, 2553-2558.
Jiang, Yimin et al., "A Novel Single-Phase Power Factor Correction Scheme", *IEEE* 1993, 287-292.
Jung, Jun-Phil et al., "Experimental and Theoretical Investigation on the Relationship Between AIN Properties and AIN-Based FBAR Characteristics", 2003 *IEEE International Frequency Control Symposium and PDA Exhibition Jointly with the 17th European Frequency and Time Forum* Sep. 3, 2003, 779-784.
Kaitila, J. et al., "Measurement of Acoustical Parameters of Thin Films", 2006 *IEEE Ultrasonics Symposium* Oct. 2006, 464-467.
Krishnaswamy, S.V. et at., "Film Bulk Acoustic Wave Resonator Technology", May 29, 1990, 529-536.
Lakin, K.M., "Bulk Acoustic Wave Coupled Resonator Filters", 2002 *IEEE International Frequency Control Symposium and PDA Exhibition* May 2002, 8-14.
Lakin, K.M., "Coupled Resonator Filters", 2002 *IEEE Ultrasonics Symposium* Mar. 2, 2002, 901-908.
Lakin, K.M. et al., "High Performance Stacked Crystal Filters for GPS and Wide Bandwidth Applications", 2001 *IEEE Ultrasonics Symposium* Jan. 1, 2001, 833-838.
Lakin, K. M. et al., "Temperature Compensated Bulk Acoustic Thin Film Resonators", *IEEE Ultrasonics Symposium, San Juan, Puerto Rico* Oct. 2000, 855-858.
Lakin, K.M., "Thin Film BAW Filters for Wide Bandwidth and High Performance Applications" *IEEE Microwave Symposium Digest*: vol. 2 Jun. 6-11, 2004, 923-926.
Lakin, K. M., "Thin Film Resonators and Filters", *IEEE Untrasonics Symposium, Caesar's Tahoe, NV* Oct. 1999, 895-906.
Lakin, et al., "Wide Bandwidth Thin Film BAW Filters", 2004 *IEEE Ultrasonics Symposium*, vol. 1, Aug. 2004, 407-410.
Larson III, John D. et al., "Measurement of Effective Kt2,Q,Rp,Rs vs. Temperature for Mo/AIN FBAR Resonators", *IEEE Ultrasonics Symposium* 2002, 939-943.

Lee, Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004, 278-281.
Li, Yunxiu at al., "AC-DC Converter with Worldwide Range Input Voltage by Series and Parallel Piezoelectric Transformer Connection", *35th Annual IEEE Power Electronics Specialists Conference* 2004.
Lobl, H.P. et al., "Piezoelectric Materials for BAW Resonators and Filters", 2001 *IEEE Ultrasonics Symposium* Jan. 1, 2001, 807-811.
Loboda, M. J., "New Solutions for Intermetal Dielectrics Using Trimethylsilane-Based PECVD Processes", *Microelectronics Eng.*, vol. 50. 2000, 15-23.
Martin, Steven J. et al., "Development of a Low Dielectric Constant Polymer for the Fabrication of Integrated Circuit Interconnect", 12 *Advanced Materials* Dec. 23, 2000, 1769-1778.
Martin, et al., "Re-growth of C-Axis Oriented AIN Thin Films", *IEEE Ultrasonics Symposium* 2006, 169-172.
Martin, et al., "Shear Mode Coupling and Tilted Gram Growth of AIN Thin Films in BAW Resonators", *IEEE Transactions on Ultrasonics, Ferroelectrics, and Frequency Control*, vol. 53 No. 7 Jul. 2006, 1339-1343.
Martinez, et al., "High confinement suspended micro-ring resonators in silicon-on-insulator", *Optics Express*, vol. 14, No. 13 Jun. 26, 2006, 6259-6263.
Merriam-Webster, "Collegiate Dictionary", *tenth edition* 2000, 2 pages.
Navas, J. et al., "Miniaturised Battery Charger using Piezoelectric Transformers", *IEEE* 2001, 492-496.
Ng, J. et al., "The Diffusion Ion-Implanted Boron in Silicon Dioxide", *AIP Conf. Proceedings*, No. 122 1984, 20-33.
Ohta, S. et al., "Temperature Characteristics of Solidly Mounted Piezoelectric Thin Film Resonators", *IEEE Ultrasonics Symposium, Honolulu, HI* Oct. 2003, 2011-2015.
Pandey, et al., "Anchor Loss Reduction in Resonant MEMS using MESA Structures", *Proceedings of the 2nd IEEE International Conference on Nano/Micro Engineered and Molecular Systems, Bangkok, Thailand* Jan. 16-19, 2007, 880-885.
Pang, W. et at., "High Q Single-Mode High-Tone Bulk Acoustic Resonator Integrated With Surface-Machined FBAR Filter", *Microwave Symposium Digest, IEEE MTT-S International* 2005, 413-416.
Parker, T. E. et al., "Temperature-Compensated Surface Acoustic-Wave Devices with SiO2 Film Overlays", *J. Appl. Physics*, vol. 50 1360-1369, Mar. 1979.
Pensala, "Thin film bulk acoustic wave devices: performance optimization and modeling", http://www.vtt.fi/inf/pdf/publications/2011/P756.pdf.
Reinhardt, Alexandre et al., "Design of Coupled Resonator Filters Using Admittance and Scattering Matrices", *2003 IEEE Ultrasonics Symposium* May 3, 2003, 1428-1431.
Ruby, R. C., "MicroMachined Thin Film Bulk Acoustic Resonators", *IEEE International Frequency Control Symposium* 1994, 135-138.
Ruby, R. et al., "The Effect of Perimeter Geometry on FBAR Resonator Electrical Performance", *Microwave Symposium Digest, 2005 IEEE MTT-S International* Jun. 12, 2005, 217-221.
Sanchez, A.M. et al., "Mixed Analytical and Numerical Design Method for Piezoelectric Transformers", *IEEE Xplore* 2003, 841-846.
Schoenholz, J.E. et al., "Plasma-Enhanced Deposition of Silicon Oxynitride Films", *Thin Solid Films* 1987, 285-291.
Schuessler, Hans H,, "Ceramic Filters and Resonators", *Reprinted from IEEE Trans. Sonics Ultrason.*, vol. SU-21 Oct. 1974, 257-268.
Shirakawa, A. A. et al., "Bulk Acoustic Wave Coupled Resonator Filters Synthesis Methodology", 2005 *European Microwave Conference*, vol. 1 Oct. 2005.
Small, M. K. at al., "A De-Coupled Stacked Bulk Acoustic Resonator (DSBAR) Filter with 2 dB Bandwidth >4%", 2007 *IEEE Ultrasonics Symposium* Oct. 2007, 604-607.
Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

(56) References Cited

OTHER PUBLICATIONS

Tas, at al., "Reducing Anchor Loss in Micromechanical Extensional Mode Resonators", *IEEE Transactions on Ultrasonics, Ferroelectrics and Frequency Control*, vol. 57 No, 2. Feb. 2010, 448-454.

Thomsen, C. et at., "Surface Generation and Detection of Phonons by Picosecond Light Pulses", *Phys. Rev. B*, vol. 34 1986, 4129.

Tiersten, H. F. at al., "An Analysis of Thickness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.

Topich, J. A. et al., "Effects of Ion Implanted Fluorine in Silicon Dioxide", *Nuclear Instr. and Methods, Cecon Rec, Cleveland, OH* May 1978, 70-73.

Tsubbouchi, K. et al., "Zero Temperature coefficient Surface Acoustic Wave Devices using Epitaxial AIN Films", *IEEE Ultrasonic symposium, San Diego, CA*, 1082 1982, 240-245.

Vasic, D et al., "A New Method to Design Piezoelectric Transformer Used in MOSFET & IGBT Drive Circuits", *IEEE 34th Annual Power Electronics Specialists Conference*, 2003 vol. 1, Jun. 15-19, 2003, 307-312.

Vasic, D et al., "A New MOSFET &IGBT Gate Drive Insulated by a Piezoelectric Transformer", *IEEE 32 nd Annual Power Electronics Specialists Conference*, 2001 vol. 3 2001, 1479-1484.

Yanagitani, at al., "Giant Shear Mode Electromechanical Coupling Coefficient k15 in C-Axis Tilted ScAIN Films", *IEEE International Ultrasonics Symposium 2010*.

Yang, C.M. et al., "Highly C Axis Oriented AIN Film Using MOCVD for 5GHx Band FBAR Filter", 2003 *IEEE Ultrasonics Symposium* Oct. 5, 2003, pp. 170-173.

"Co-pending U.S. Appl. No. 13/286,038, filed Oct. 31, 2011."

Lynch, A.C., "Precise Measurements on Dielectric and Magnetic Materials", *IEEE Transactions on Instrumentation and Measurement* vol. IM-23, No. 4 Dec. 1974, 425-431.

\* cited by examiner

BULK ACOUSTIC RESONATOR COMPRISING PIEZOELECTRIC LAYER AND INVERSE PIEZOELECTRIC LAYER

BACKGROUND

Transducers generally convert electrical signals to mechanical signals or vibrations, and/or mechanical signals or vibrations to electrical signals. Acoustic transducers, in particular, convert electrical signals to acoustic waves and acoustic waves to electrical signals using inverse and direct piezoelectric effects. Acoustic transducers generally include acoustic resonators, such as bulk acoustic wave (BAW) resonators and surface acoustic wave (SAW) resonators and may be used in a wide variety of electronic applications, such as cellular telephones, personal digital assistants (PDAs), electronic gaming devices, laptop computers and other portable communications devices. For example, BAW resonators may be used for electrical filters and voltage transformers. Generally, an acoustic resonator has a layer of piezoelectric material between two conductive plates (electrodes), which may be formed on an acoustic reflector. BAW resonator devices, in particular, generate acoustic waves that can propagate in lateral directions when stimulated by an applied time-varying electric field, as well as higher order harmonic mixing products. The laterally propagating modes and the higher order harmonic mixing products may have a deleterious impact on functionality.

What is needed, therefore, is a device useful in mitigating acoustic losses at the boundaries of the BAW resonator to improve mode confinement in the region of overlap of the top electrode, the piezoelectric layer, and the bottom electrode of a BAW resonator (commonly referred to as the active region).

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
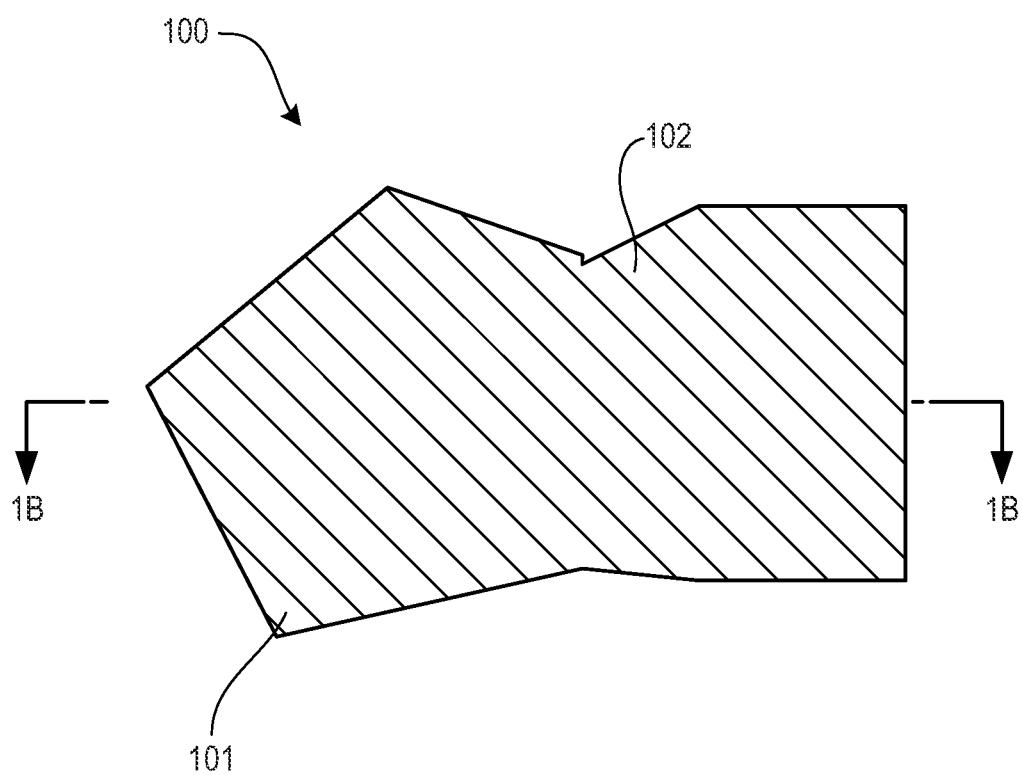
FIG. 1A shows a top-view of an FBAR in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to bulk acoustic wave (BAW) resonators comprising FBARs, double bulk acoustic resonators (DBARs) and coupled resonator filters (CRFs). As will be described more fully below, the FBARs, DBARs and CRFs of the representative embodiments comprise a first piezoelectric layer having a first c-axis oriented along a first direction (often referred to herein as the "p", or "piezo", layer); and a second piezoelectric layer adjacent to the first piezoelectric layer and having layer has a second c-axis oriented in a second direction that is substantially antiparallel to the first direction (often referred to herein as the "ip", or "inverse-piezo", layer). The crystals of the both the p-layer and the ip-layer grow in columns that are perpendicular to the plane of the electrodes. As such, the c-axis orientations of crystals of the first piezoelectric layer are substantially aligned with one another and the c-axis orientations of crystals of the second piezoelectric layer are substantially aligned with one another layer (i.e., antiparallel to the c-axis orientations of crystals of the first piezoelectric layer). Notably, and as described more fully below, DBARs and CRFs of the representative embodiments comprise additional piezoelectric layers having c-axis orientations in opposing directions. So, for example, in addition to the first piezoelectric layer (p-layer) and the second piezoelectric layer (ip-layer) described above, a DBAR of a representative embodiment comprises a third piezoelectric layer having a third c-axis oriented parallel to the first direction (i.e., a p-layer), and a fourth piezoelectric layer disposed having a fourth c-axis oriented parallel to the second direction.

As described more fully below, in certain embodiments, the second piezoelectric layer has a piezoelectric coupling coefficient ($e_{33ip}$) in a range between approximately −0.1 times a piezoelectric coupling coefficient ($e_{33p}$) of the first piezoelectric layer and approximately −2 times a piezoelectric coupling coefficient ($e_{33p}$) of the first piezoelectric layer. In certain embodiments, therefore, the magnitude of the piezoelectric coupling coefficient ($e_{33p}$) of the first piezoelectric layer is substantially equal in magnitude but opposite sign of the coefficient ($e_{33ip}$) of the second piezoelectric layer (i.e., $e_{33p}=(-1) e_{33ip}$). Moreover, in certain embodiments, in addition to the first and second piezoelectric layers, DBARs and CRFs have third and fourth piezoelectric layers where the fourth piezoelectric layer has a piezoelectric coupling coefficient ($e_{33ip}$) in a range between approximately −0.1 times a piezoelectric coupling coefficient ($e_{33p}$) of the third piezoelectric layer and approximately −2 times a piezoelectric coupling coefficient ($e_{33p}$) of the fourth piezoelectric layer. In certain embodiments, therefore, the magnitude of the piezoelectric coupling coefficient ($e_{33p}$) of the third piezoelectric layer is substantially equal in magnitude but opposite sign of the coefficient ($e_{33ip}$) of the fourth piezoelectric layer (i.e., $e_{33p}=(-1) e_{33ip}$).

The piezoelectric materials of each of the first piezoelectric layer 107 and the second piezoelectric layer 108 may be referred to as a highly-textured c-axis piezoelectric layer. Highly-textured c-axis piezoelectric material may be fabricated according to one of a variety of known methods, such as disclosed in U.S. Pat. No. 6,060,818, to Ruby, et al., the disclosure of which is specifically incorporated herein by reference. Furthermore, the fabrication of the first piezoelectric layer 107 and the second piezoelectric layer 108 of the representative embodiments may be effected according to the teachings of commonly assigned U.S. Patent Application Publications: 20110180391 entitled "Method of Fabricating Piezoelectric Material with Selected C-Axis Orientation" to John L. Larson, III, et al. and filed on Jan. 22, 2010; and 20110121689, entitled "Polarity Determining Seed Layer and Method of Fabricating Piezoelectric Materials with Specific C-Axis," to Kevin Grannen, et al. and filed on Nov. 23, 2009. The entire disclosures of these patent application publications are specifically incorporated herein by reference.

Acoustic resonators, and particularly FBARs, can be employed in a variety of configurations for RF and microwave devices such as filters and oscillators operating in a variety of frequency bands. For use in mobile communication devices, one particular example of a frequency band of interest is the 850 MHz "cellular band." In general, the size of a BAW resonator increases with decreasing frequency such that an FBAR for the 850 MHz band will be substantially larger than a similar FBAR for the 2 GHz personal communication services (PCS) band. Meanwhile, in view of continuing trends to miniaturize components of mobile communication device, it may be conceptually imagined that a BAW resonator having a relatively large size may be cut in half, and the two halves, each of which may be considered to be a smaller acoustic resonator, may be stacked upon one another. An example of such a stacked BAW resonator is a DBAR. In certain applications, the BAW resonators provide DBAR-based filters (e.g., ladder filters).

A CRF comprises a coupling structure disposed between two vertically stacked FBARs. The CRF combines the acoustic action of the two FBARs and provides a bandpass filter transfer function. For a given acoustic stack, the CRF has two fundamental resonance modes, a symmetric mode and an anti-symmetric mode, of different frequencies. The degree of difference in the frequencies of the modes depends, inter alia, on the degree or strength of the coupling between the two FBARs of the CRF. If the degree of coupling between the two FBARs is too great (over-coupled), the passband is unacceptably wide, and an unacceptable 'swag' or 'dip' in the center of the passband results, as does an attendant unacceptably high insertion loss in the center of the passband. If the degree of coupling between the FBARs is too low (under-coupled), the passband of the CRF is too narrow.

Certain details of FBARs, DBARs, CRFs, materials thereof and their methods of fabrication may be found in one or more of the following commonly owned U.S. Patents, Patent Application Publications and Patent Applications: U.S. Pat. No. 6,107,721, to Lakin; U.S. Pat. Nos. 5,587,620, 5,873,153 and 6,507,983 to Ruby, et al.; U.S. Pat. No. 7,629,865 to Ruby, et al.; U.S. Pat. No. 7,280,007 to Feng, et al.; U.S. Patent Application Publication No. 2007/0205850 to Jamneala, et al.; U.S. Pat. No. 7,388,454 to Richard C. Ruby, et al; U.S. Pat. No. 8,248,185 to Choy, et al.; and U.S. Patent Application Publication No. 2010/0327994 to Choy, et al. Examples of DBARs and CRFs as well as their materials and methods of fabrication, may be found in U.S. Pat. No. 7,889,024 to Paul Bradley et al., U.S. Patent Application Publication No. 20120248941 of Shirakawa et al., and filed on Mar. 29, 2011, U.S. Patent Application Publication No. 20120218056 of Burak et al., and filed on Feb. 28, 2011, U.S. Patent Application Publication No. 20120218055 to Burak, et al. filed on Mar. 29, 2011, U.S. Patent Application Publication No. 20120280767 of Burak et al., and filed on May 5, 2011, and U.S. Pat. No. 8,330,325 to Burak, et al., and filed on Jun. 16, 2011. The disclosures of these patents, patent application publications and patent applications are specifically incorporated herein by reference. It is emphasized that the components, materials and method of fabrication described in these patents and patent applications are representative and other methods of fabrication and materials within the purview of one of ordinary skill in the art are contemplated.

Embodiments Comprising an FBAR

FIG. 1A shows a top view of a film bulk acoustic wave resonator (FBAR) 100 in accordance with a representative embodiment. The FBAR 100 comprises a top electrode 101

(referred to below as second electrode 101), illustratively comprising five (5) sides, with a connection side 102 configured to provide the electrical connection to an interconnect 102'. The interconnect 102' provides electrical signals to the top electrode 101 to excite desired acoustic waves in piezoelectric layers (not shown in FIG. 1) of the DBAR 100.

Figure 1B:
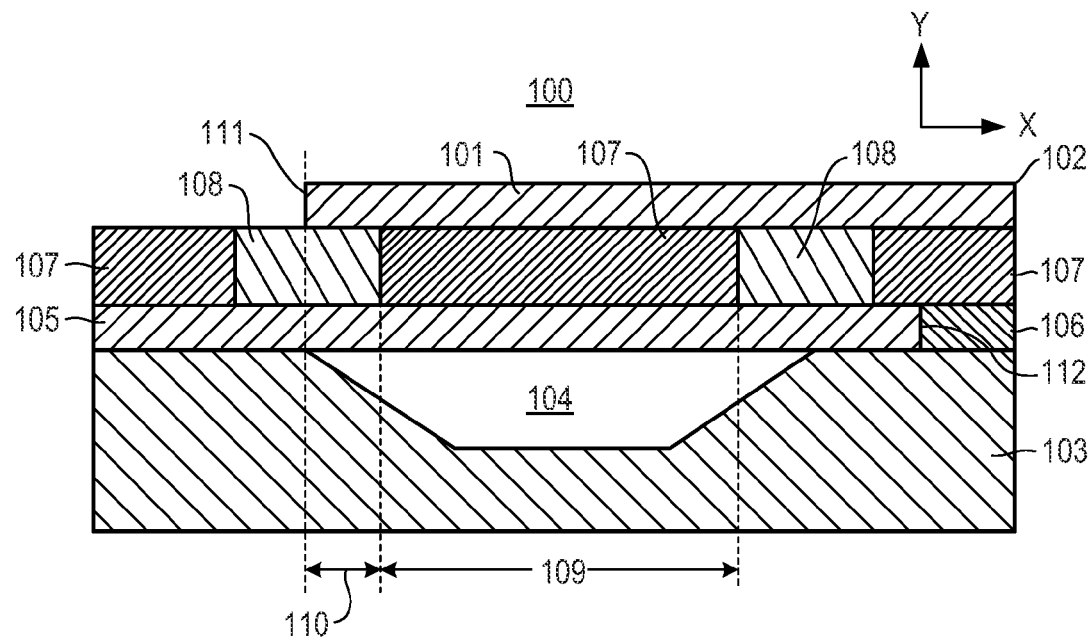
FIG. 1B is a cross-sectional view of the FBAR of FIG. 1A, taken along the line 1B-1B.

FIG. 1B shows a cross-sectional view of FBAR 100 depicted in FIG. 1A and taken along the line 1B-1B. A substrate 103 comprises a cavity 104 or other acoustic reflector (e.g., a distributed Bragg grating (DBR) (not shown)). A first electrode 105 is disposed over the substrate 103 and is suspended over the cavity 104. A planarization layer 106 is provided over the substrate 103 and may be non-etchable borosilicate glass (NEBSG). In general, planarization layer 106 does not need to be present in the structure (as it increases overall processing cost), but when present, it may serve to improve the quality of growth of subsequent layers (e.g., highly textured c-axis piezoelectric material), improve the performance of the FBAR 100 through the reduction of "dead" resonator (FBAR) regions and simplify the fabrication of the various layers of the FBAR 100. A first piezoelectric layer 107 is provided over the first electrode 105, and comprises highly-textured c-axis piezoelectric material such as aluminum nitride (AlN) or zinc oxide (ZnO). The c-axis of the first piezoelectric layer 107 is oriented along a first direction (e.g., parallel to the +y-direction in the coordinate system depicted in FIG. 1B). The first piezoelectric layer 107 may be referred to herein as the "p" layer, or type $C_p$ piezoelectric layer. A second piezoelectric layer 108 adjacent to the first piezoelectric layer has a second c-axis oriented in a second direction (e.g., parallel to the −y-direction in the coordinate system depicted in FIG. 1B) that is substantially antiparallel to the first direction. The second piezoelectric layer 108 may be referred to herein as the "inverse-piezoelectric (ip)" or Type $C_n$ piezoelectric layer. In representative embodiments, the first piezoelectric layer 107 has a thickness (y-direction in the coordinate system of FIG. 1B) that is substantially identical to that of the second piezoelectric layer 108.

The crystals of the both the first piezoelectric layer 107 (p-layer) and the second piezoelectric layer 108 (ip-layer) grow in columns that are perpendicular to the plane of the electrodes. As such, the c-axis orientations of crystals of the first piezoelectric layer 107 are substantially aligned with one another and the c-axis orientations of crystals of the second piezoelectric layer 108 are substantially aligned with one another layer and are antiparallel to the c-axis orientations of crystals of the first piezoelectric layer 107. The first piezoelectric layer 107 and the second piezoelectric layer 108 are typically made from the same substance (e.g., AlN or ZnO). The second electrode 101 is disposed over the first piezoelectric layer 107 and over the second piezoelectric layer 108.

In accordance with representative embodiments, the second piezoelectric layer 108 has a piezoelectric coupling coefficient ($e_{33ip}$) in a range between approximately −0.1 (negative 0.1) times a piezoelectric coupling coefficient ($e_{33p}$) of the first piezoelectric layer 107 and approximately −2 (negative 2) times a piezoelectric coupling coefficient ($e_{33p}$) of the first piezoelectric layer 107. In certain embodiments, therefore, the magnitude of the piezoelectric coupling coefficient ($e_{33p}$) of the first piezoelectric layer is substantially equal in magnitude but opposite sign of the coefficient ($e_{33ip}$) of the second piezoelectric layer (i.e., $e_{33p}=(-1)\ e_{33ip}$).

The overlap of the cavity 104, the first electrode 105, first piezoelectric layer 107, and the second electrode 101 defines an active region 109 of the FBAR 100. In representative embodiments described below, acoustic losses at the boundaries of FBAR 100 are mitigated to improve mode confinement in the active region 109. In particular, the width of an overlap 110 of the second electrode 101 and the second piezoelectric layer 108 is selected to reduce acoustic losses resulting from scattering of acoustic energy at a termination edge 111 of the second electrode 101 and away from the active region 109. Similarly, the location of the termination edge 112 of the first electrode 105 is selected to reduce acoustic losses resulting from scattering of acoustic energy at the termination edge 112.

For simplicity of description, it is assumed that in regions adjacent to termination edges 111, 112, only the imaginary thickness extensional (TE) mode exists. In addition, it is assumed that only an evanescent TE mode is predominantly excited by the E-field, and that propagating TE modes and their affects are ignored as being insignificant. In a known FBAR device that does not include the p-layer/ip-layer structure of the present teachings, the solutions to the wave equation reveal that the field displacement Uz at the termination edges of the lower and upper electrodes is excited at comparatively large amplitude, and the impedance discontinuity at the termination edges of the lower and upper electrodes will cause a significant scattering of energy from the excited TE modes to all other modes supported by the structure, thus yielding acoustic losses and reduced Q.

Figure 1C:
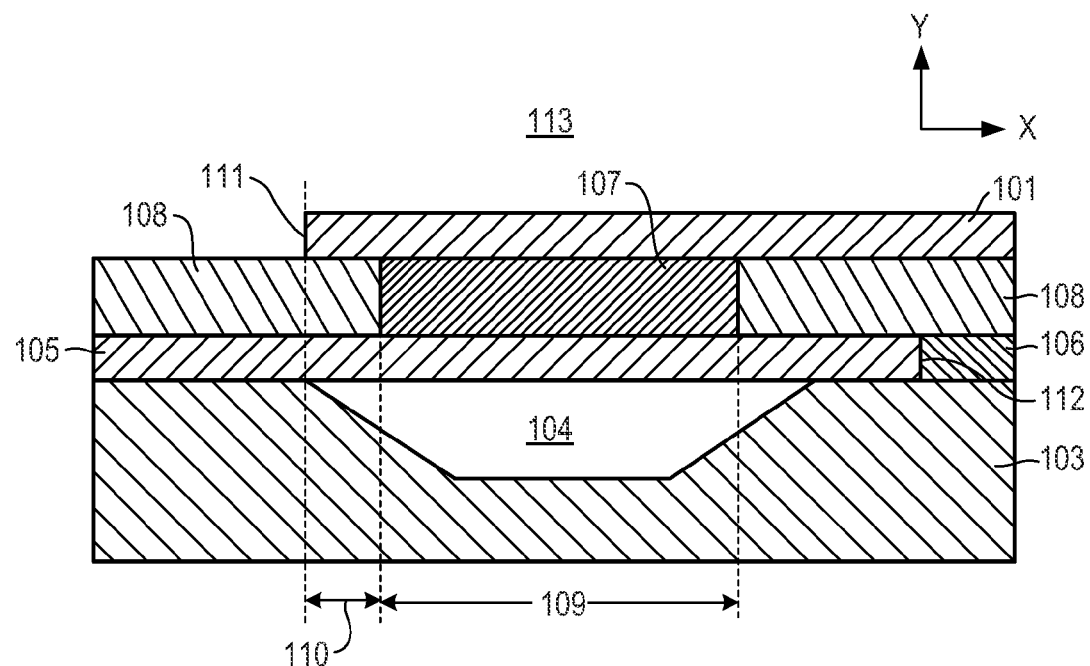
FIG. 1C is a cross-sectional view of an FBAR in accordance with a representative embodiment.

FIG. 1C shows a cross-sectional view of FBAR 113 in accordance with a representative embodiment. Many aspects of the FBAR 113 and its methods of fabrication are common to those of FBAR 100 and are not repeated. The FBAR 113 comprises first piezoelectric layer 107 and second piezoelectric layer 108 adjacent thereto. Unlike FBAR 100 in which the second piezoelectric layer 108 is adjacent to first piezoelectric layer 107 on two sides (i.e., the second piezoelectric layer 108 is a ring of ip material in p material), the second piezoelectric layer 108 of FBAR 113 is substantially continuous and is not surrounded by first piezoelectric layer 107. As such, the second piezoelectric layer 108 is "unbounded." Notably, the FBAR 100 and the FBAR 113 are substantially operationally the same, provided that the interactions between second piezoelectric layer 108 and the termination edge 111 of the second electrode 101, and the interactions between second piezoelectric layer 108 and the termination edge 112 of the first electrode 105 are optimized for improved Q.

In the illustrative embodiments described above, the second piezoelectric layer 108 is provided along all sides of FBAR 108 and FBAR 113 (i.e., all sides of the illustrative five-sided FBAR 100, 113). It is noted that this is not essential, and in other embodiments the second piezoelectric layer 108 is not disposed on all sides (e.g., the second piezoelectric layer 108 may be disposed on four of five sides).

Figure 1D:
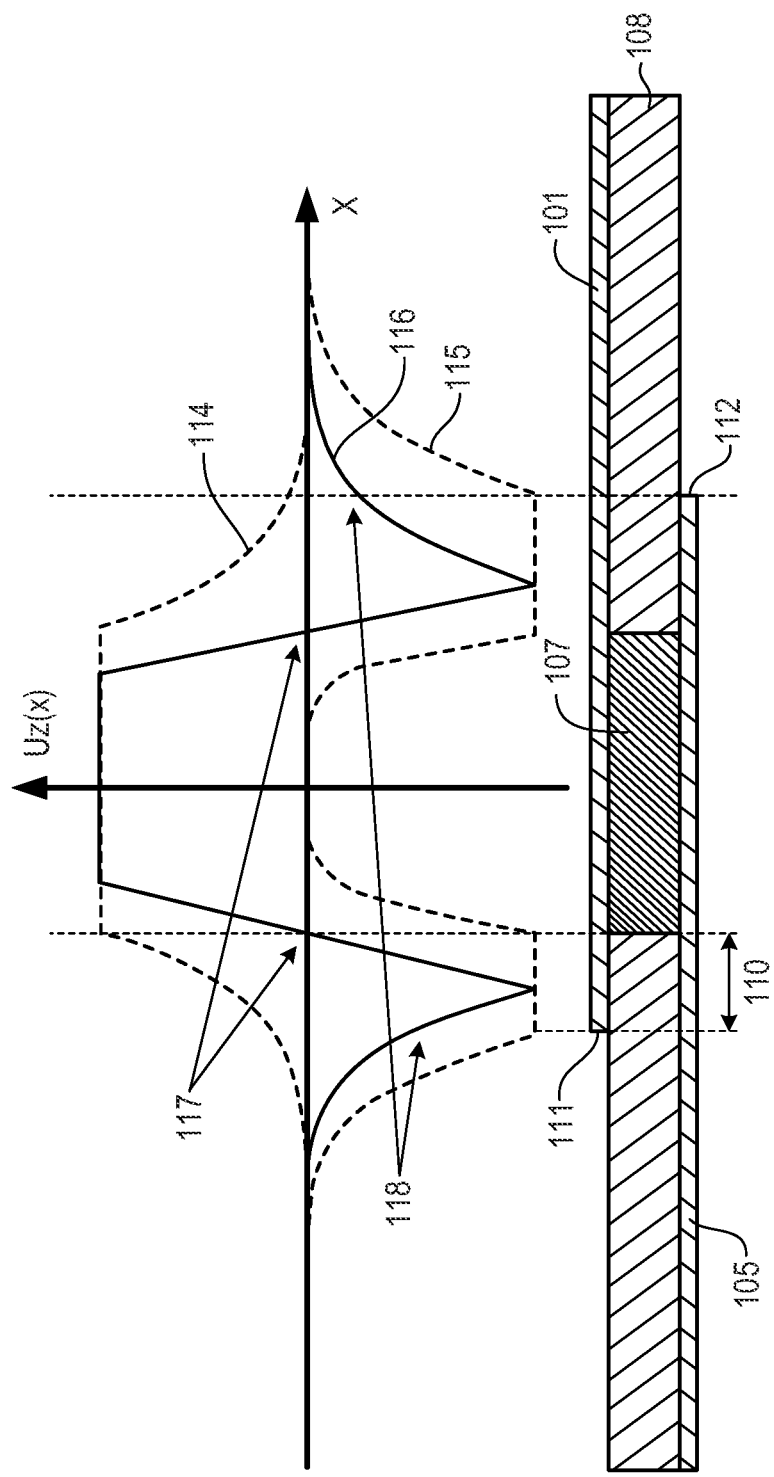
FIG. 1D is a graph of the mechanical displacement wave-function of the thickness extensional (TE) mode at the top surface as a function of position (Uz(x)) in accordance with a representative embodiment.

FIG. 1D is a graph of the mechanical displacement wavefunction of the evanescent thickness extensional (TE) mode as a function of position (Uz(x)) shown on the top surface of FBAR 113. For perspective and ease of description, the germane layers of the FBAR 113 are depicted below the graph at their positions along the x-axis of the graph. Notably, in the present example, $e_{33p}=(-1)\ e_{33ip}$. Curve 114 represents the field displacement Uz of the first piezoelectric layer 107 as a function of x, and curve 115 represents the field displacement Uz of the second piezoelectric layer 108 as a function of x. The superposition of the field displacement for both the first piezoelectric layer 107 and the second piezoelectric layer 108 (i.e., the total distribution for the acoustic stack) is represented by curve 116, again as a function of x.

Points 117 represent the field displacement Uz at the interface of the first piezoelectric layer 107 and the second piezoelectric layer 108. Because the piezoelectric coupling coefficients of the first piezoelectric layer 107 and the second piezoelectric layer 108 are equal in magnitude but opposite in sign, at the interface the net field displacement Uz is substantially 0 due to a perfect compensation of motion. However, at termination edges 111, 112 of the second and first electrodes 101, 105 of FBAR 113, the magnitude (points 118) of total field displacement Uz is roughly 50% of the magnitude at point 117 at a center of the active region of the FBAR 113. (Notably, the 50% reduction of the total field displacement Uz is merely illustrative. The reduction of the total field displacement Uz is determined by acoustic stack design (determining the decay length of the evanescent mode) and width of the overlap 110.)) The reduction in the magnitude of the total field displacement Uz provided by the first piezoelectric layer 107 and the second piezoelectric layer 108 of FBAR 113 of a representative embodiment, when compared to a known FBAR that does not include the second piezoelectric layer 108, results in reduced scattering of acoustic energy at the termination edges 111, 112. Reduced scattering of acoustic energy at the termination edges 111, 112 of the first and second electrodes 105, 101, results in improved confinement of desired modes in the active region 109 of the FBAR 113, and a resultant improvement in Q and $R_p$.

Figure 1E:
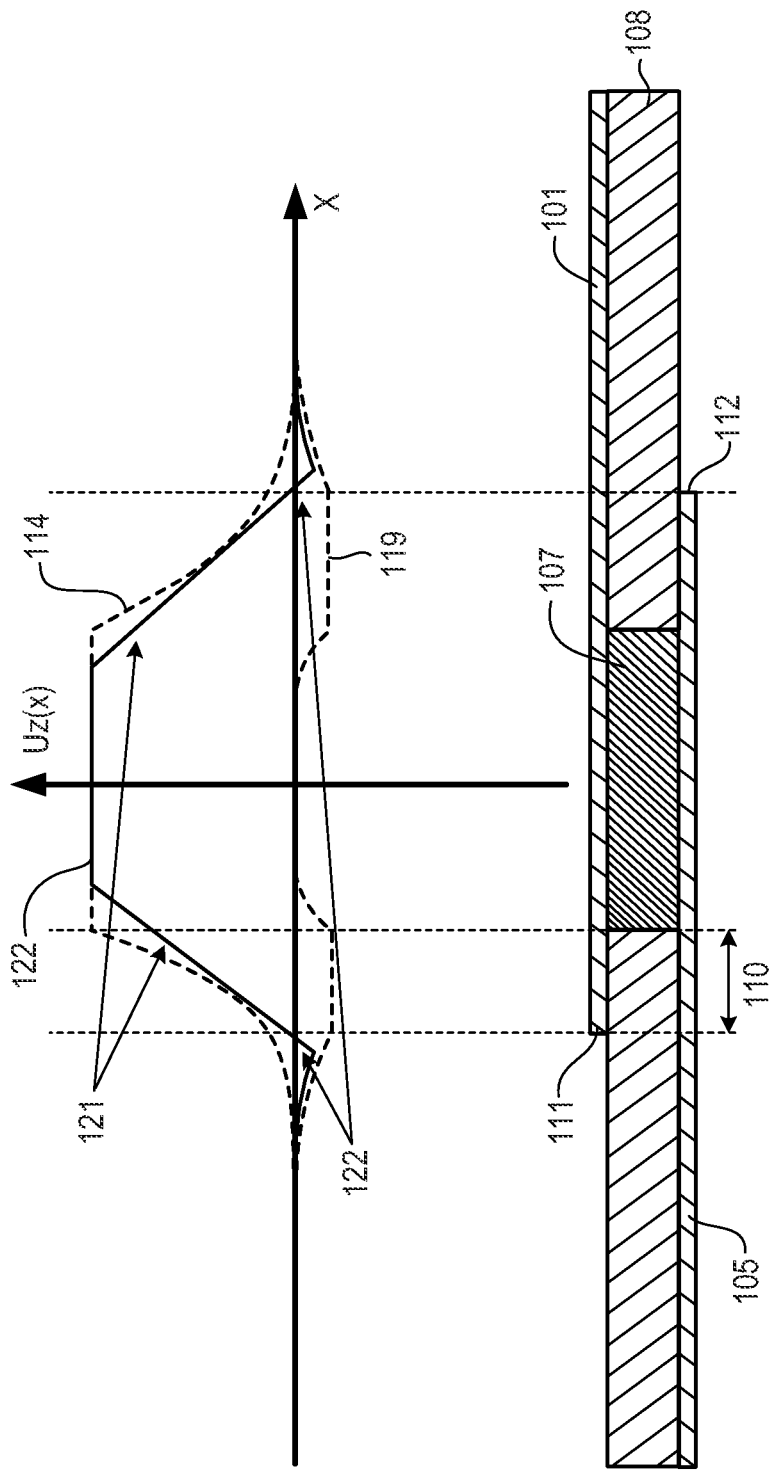
FIG. 1E is a graph of the mechanical displacement wave-function of the thickness extensional (TE) mode at the top surface as a function of position (Uz(x)) in accordance with another representative embodiment.

FIG. 1E is a graph of the wavefunction of the evanescent thickness extensional (TE) mode as a function of position (Uz(x)) of FBAR 113. For perspective and ease of description, the germane layers of the FBAR 113 are depicted below the graph at their positions along the x-axis of the graph. Notably, in the present example, $e_{33ip}=(-\alpha) e_{33p}$ where ($0<\alpha<1$). Curve 114 represents the field displacement Uz of the first piezoelectric layer 107 as a function of x, and curve 119 represents the field displacement Uz of the second piezoelectric layer 108 as a function of x. The superposition of the field displacement Uz for both the first piezoelectric layer 107 and the second piezoelectric layer 108 (i.e., the total distribution for the acoustic stack) is represented by curve 120, again as a function of x.

At points 121 the field displacement Uz at the interface of the first piezoelectric layer 107 and the second piezoelectric layer 108 is not zero due to the difference in the piezoelectric coupling coefficients of the first piezoelectric layer 107 and the second piezoelectric layer 108. As such, there is a net field displacement Uz. It is noted that since first and second piezoelectric layers 107, 108 have substantially identical elastic properties (symmetry, density and stiffness constants), no acoustic impedance discontinuity occurs at the interface between the first and second piezoelectric layers 107, 108, and therefore no scattering of acoustic energy occurs. However, at the termination edges 111, 112 of the second and first electrodes 101, 105 of FBAR 113, the magnitude (at points 122) of total field displacement Uz is roughly 0. This represents a maximum reduction in the magnitude of the total field displacement Uz at the termination edges 111, 112 provided by the first piezoelectric layer 107 and the second piezoelectric layer 108 of FBAR 113 of a representative embodiment, when compared to a known FBAR that does not include the second piezoelectric layer 108. This results in significantly reduced scattering of acoustic energy at the termination edges 111, 112. Reduced scattering of acoustic energy at the termination edges 111, 112 of the first and second electrodes 105, 101, results in improved confinement of desired modes in the active region 109 of the FBAR 113, and a resultant improvement in Q and $R_p$.

Since $\alpha<1$ in the inverse-piezo layer it is possible to find a combination of $\alpha$ and overlap 110 between the first and second electrodes 105, 101 and the second piezoelectric layer 108 such that the total field distribution at the termination edges 111, 112 of the first and second electrodes 105, 101 is substantially zero. This configuration should yield the lowest scattering at the termination edges 111, 112, and therefore the highest Q-values of the FBAR 113. Also note that such combination of $\alpha$ and width of the second piezoelectric layer 108 is not unique, meaning that for a given combination of p-layer/ip-layer and piezoelectric coupling coefficients (i.e., $e_{33ip}=(-\alpha) e_{33p}$), a width of the second piezoelectric layer 108 can be determined to yield zero displacement at the termination edges 111, 112. However, such combination depends explicitly on a decay constant of an evanescent TE mode of a given acoustic stack. For example, if evanescent TE mode requires longer distance to decay (i.e., has a longer evanescent tail), a wider overlap 110 between first and second electrodes 105, 101 and the second piezoelectric layer 108 would be required for substantially complete suppression of motion at the termination edges 111, 112 of the first and second electrodes 105, 101. Similarly, if the evanescent TE mode requires longer distance to decay, a larger magnitude of a may be needed for complete suppression of motion at the termination edges 111, 112 of the first and second electrodes 105, 101. However, it should appreciated by one of ordinary skill in the art that the mechanism to suppress motion at the termination edges 111, 112 of the first and second electrodes 105, 101 presented in FIGS. 1D-1E is a simplification of the actual case. In particular, for structures shown in FIGS. 1D-1E the thicknesses (y-direction according to the coordinate system of FIGS. 1D, 1E) of the first electrode 105 and the second electrode 101 are assumed to be small in comparison to the thickness of the first piezoelectric layer 107. Therefore, a single complex TE mode description for all parts of these structures can be applied. In practical geometries, like those shown in FIGS. 2B-2C a complete multi-mode approach (including evanescent, propagating, and complex TE modes, as well as shear and flexural modes) should be used to find the optimum width of the overlap of the overlap of the second electrode and the second piezoelectric layer for highest quality factor (Q), which can be determined either numerically or experimentally.

Figure 1F:
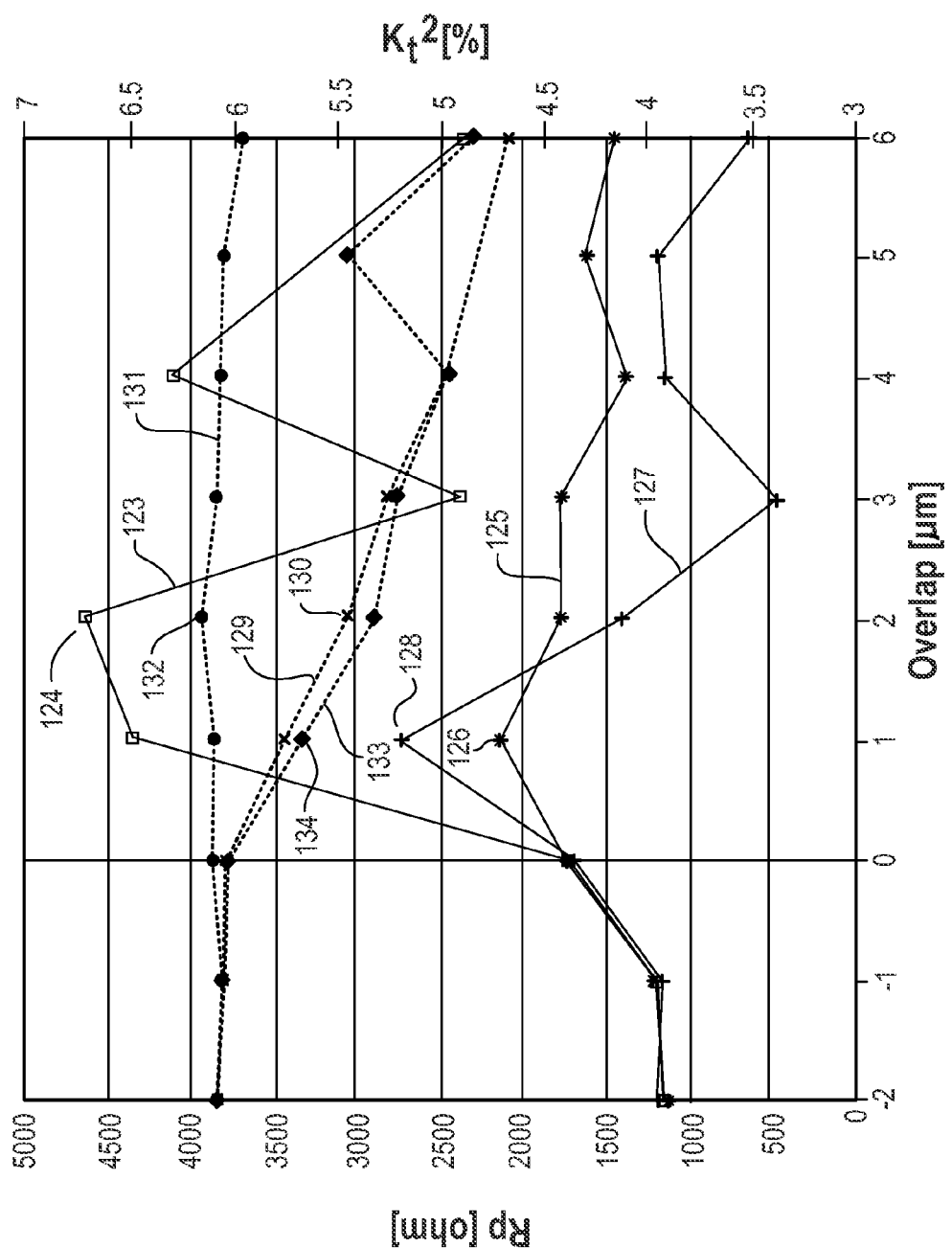
FIG. 1F is a graph showing the parallel impedance (Rp) (left axis) and the electro-mechanical coupling coefficient ($kt^2$) (right axis) versus width of an overlap of an electrode and an inverse piezoelectric layer of an FBAR in accordance with a representative embodiment.

FIG. 1F is a graph showing the simulated parallel impedance (Rp) (left axis) and the electro-mechanical coupling coefficient ($kt^2$) (right axis) versus width of an overlap of an electrode and an inverse piezoelectric layer of an FBAR in accordance with a representative embodiment. Notably, inverse piezoelectric layers (e.g., second piezoelectric layer 108) having different piezoelectric coupling coefficients ($e_{33ip}$) are depicted over a range of overlap values (e.g., overlap 110) of second electrode 101.

Curve 123 depicts Rp for an FBAR wherein $e_{33ip}=(-0.5) e_{33p}$. At point 124, where the overlap is approximately 2.0 μm, Rp is approximately 4600Ω. By comparison, graph 125 depicts an FBAR in which $e_{33ip}=e_{33p}$ (i.e., no ip-layer) which exhibits a peak Rp at point 126 of approximately 2100Ω, and an overlap of approximately 1.0 μm. Curve 127 depicts Rp for an FBAR wherein $e_{33ip}=(-1.0) e_{33p}$. At point 128, the maximum Rp for this combination is approximately 2700Ω.

As noted above in connection of the description of FIGS. 1D and 1E, the combination of the overlap 110 of the second electrode 101 with the second piezoelectric layer 108, and the selection of the magnitude of $e_{33ip}$ relative to $e_{33p}$ influences the resultant total mechanical displacement Uz at certain points of the FBAR 113. Therefore the selection of the overlap 110 and the relative piezoelectric coupling coefficients can result in different amplitudes of the resultant total field displacement Uz at certain scattering locations (e.g., termination edges 111, 112 of the FBAR 113). So, from the data presented in FIG. 1F, minimal scattering is realized by the selection of $e_{33ip}=(-0.5) e_{33p}$, and overlap of approximately 2.0 to provide maximum Rp. Notably, the fact that the best Rp obtained for $e_{33ip}=(-0.5)\, e_{33p}$ case is better than Rp obtained for $e_{33ip}=(-1)\, e_{33p}$ from numerical simulations of for a realistic FBAR 113 structure is in qualitative agreement with a simplified model presented in connection with FIGS. 1D-1E. The same fact is also true for other BAW resonators (DBARs and CRFs) described fully below.

Curve 129 depicts the electro-mechanical coupling coefficient ($kt^2$) versus overlap 110 in which $e_{33ip}=(-0.5)\, e_{33p}$. At point 130, which corresponds to an overlap of approximately 2.0 µm and maximum Rp, $kt^2$ is approximately 5.5%. Curve 131 depicts the electro-mechanical coupling coefficient ($kt^2$) versus overlap 110 in which $e_{33ip}=e_{33p}$. By comparison to the overlap for maximum Rp, at point 132 $kt^2$ is approximately 6%. At point 130, which corresponds to an overlap of approximately 2.0 µm and maximum Rp, $kt^2$ is approximately 5.5%. Curve 133 depicts the electro-mechanical coupling coefficient ($kt^2$) versus overlap 110 in which $e_{33ip}=(-1)\, e_{33p}$. By comparison to the overlap for maximum Rp, at point 134 the electromechanical coupling coefficient ($kt^2$) is approximately 5.7%. In general, the decrease of the electromechanical coupling coefficient ($kt^2$) as a function of overlap 110 is expected since the total mechanical motion in the second piezoelectric layer 108 is beneficially suppressed resulting in an increased Q-factor. At the same time, the electric field driving the second piezoelectric layer 108 is substantially the same as the electric field in the first piezoelectric layer 107. As such, the effective coupling between mechanical in electrical fields is smaller in second piezoelectric layer 108 compared to the first piezoelectric layer 107. Therefore, the total electromechanical coupling coefficient $kt^2$ in FBARs 100, 113 may be smaller in comparison to the electromechanical coupling coefficient ($kt^2$) of a known FBAR.

Figure 1G:
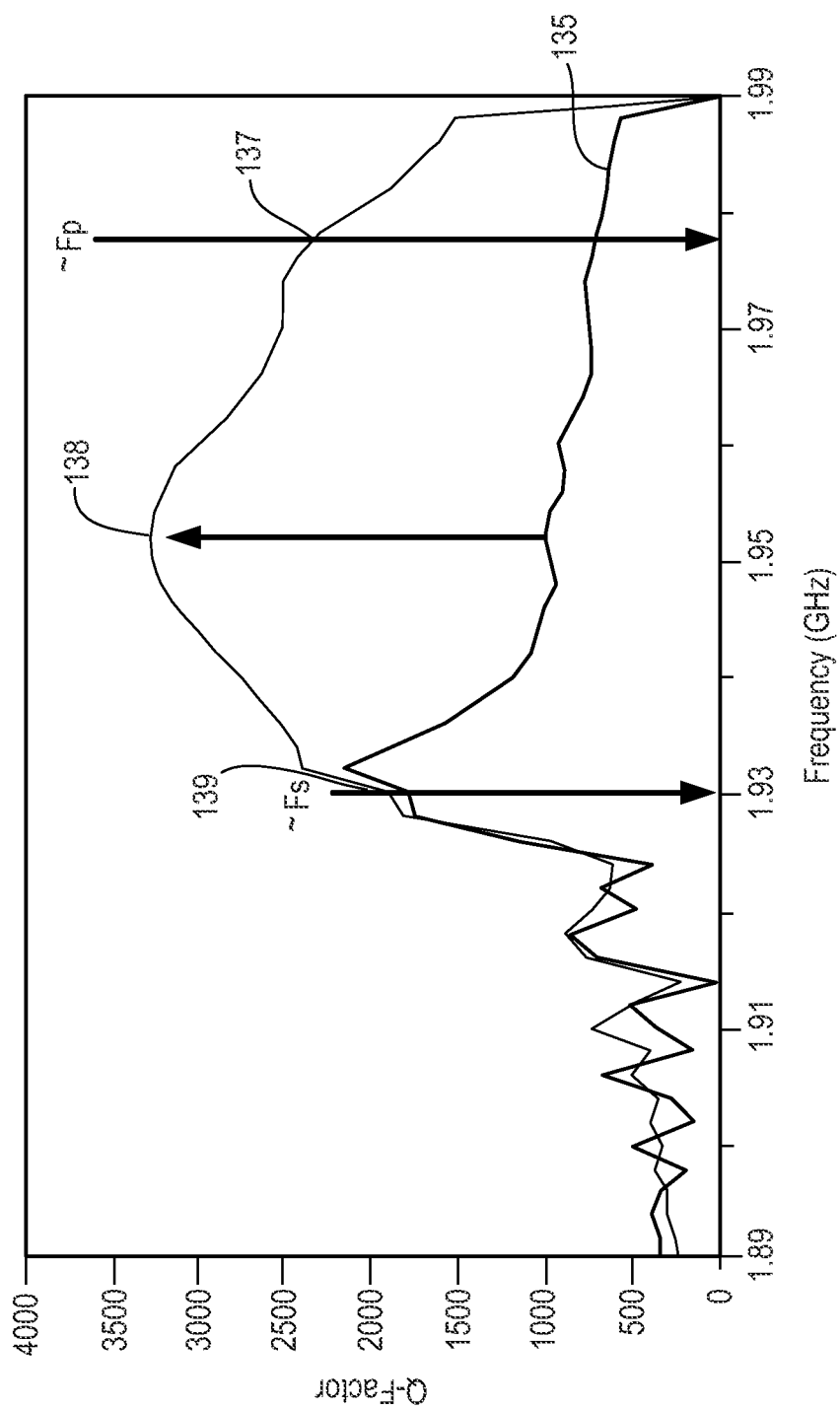
FIG. 1G is a graph showing the quality factor Q of a known FBAR and FBAR in accordance with representative embodiment.

FIG. 1G is a graph showing the simulated Q-factor versus frequency of an FBAR in accordance with a representative embodiment. Curve 135 depicts the Q versus frequency for a known FBAR, which does not include a piezoelectric/inverse piezoelectric structure of the representative embodiments described above. Curve 136 depicts Q versus frequency of an FBAR in accordance with a representative embodiment (e.g., FBAR 100 or FBAR 113) comprising piezoelectric/inverse piezoelectric structure as described above. Notably, the piezoelectric coupling coefficient of the inverse piezoelectric layer is one-half the magnitude and of opposite sign to the piezoelectric coupling coefficient of the inverse piezoelectric layer ($e_{33ip}=(-0.5)\, e_{33p}$). At series resonance frequency ($F_s$) there is a slight improvement in Q (point 138) exhibited in the FBAR according to representative embodiments. However, at parallel resonance frequency ($F_p$), a known FBAR exhibits Q of approximately 1100, and by contrast, an FBAR of a representative embodiment exhibits Q of 2500 (point 136), and Rp is approximately 4500Ω. Moreover, at approximately 1.95 GHz Q of an FBAR of a representative embodiment is approximately thrice (3 times, point 138) that of a known FBAR, which does not include the piezoelectric/inverse piezoelectric structure.

Embodiments Comprising a Double Bulk Acoustic Resonator (DBAR)

Figure 2A:
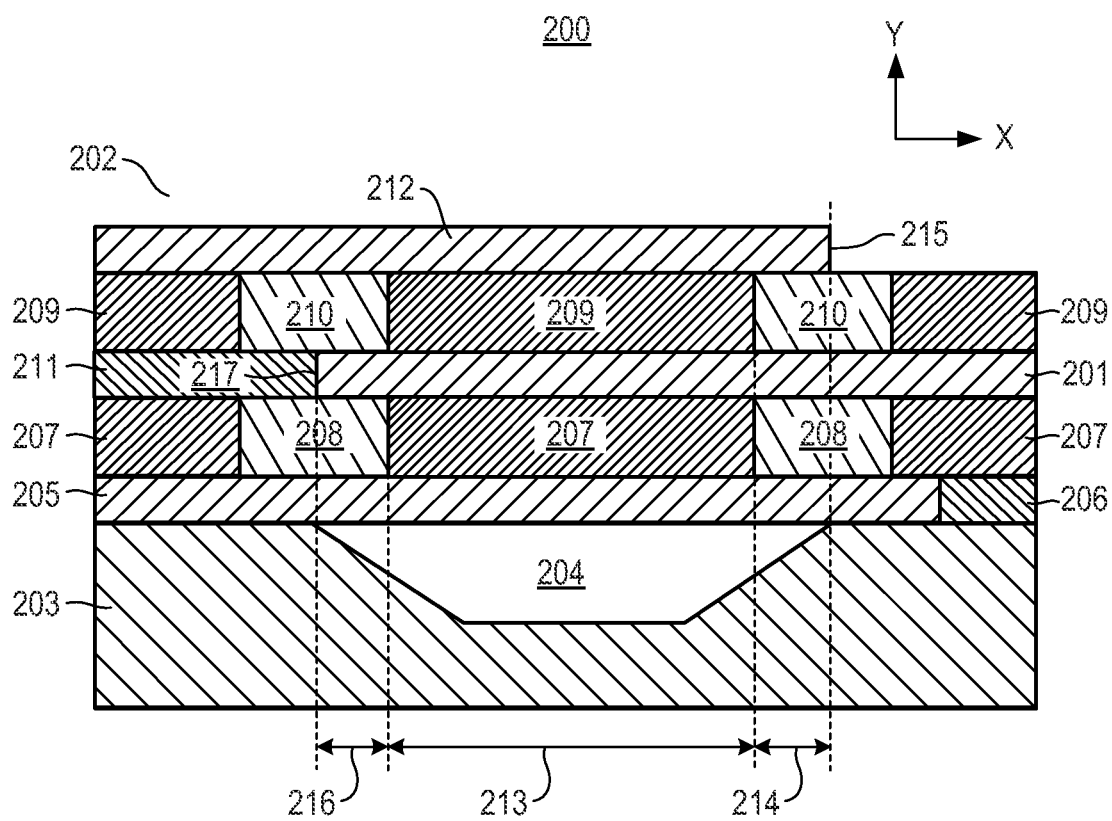
FIGS. 2A-2C are cross-sectional views of a double bulk acoustic resonator (DBAR) in accordance with representative embodiments.
Figure 2B:
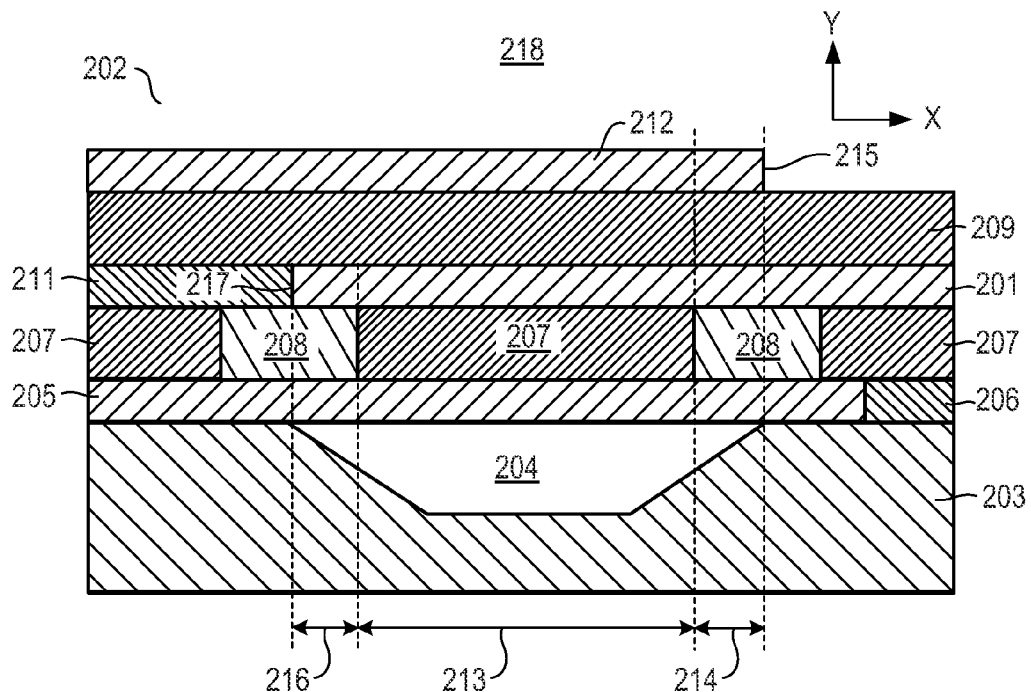
Figure 2C:
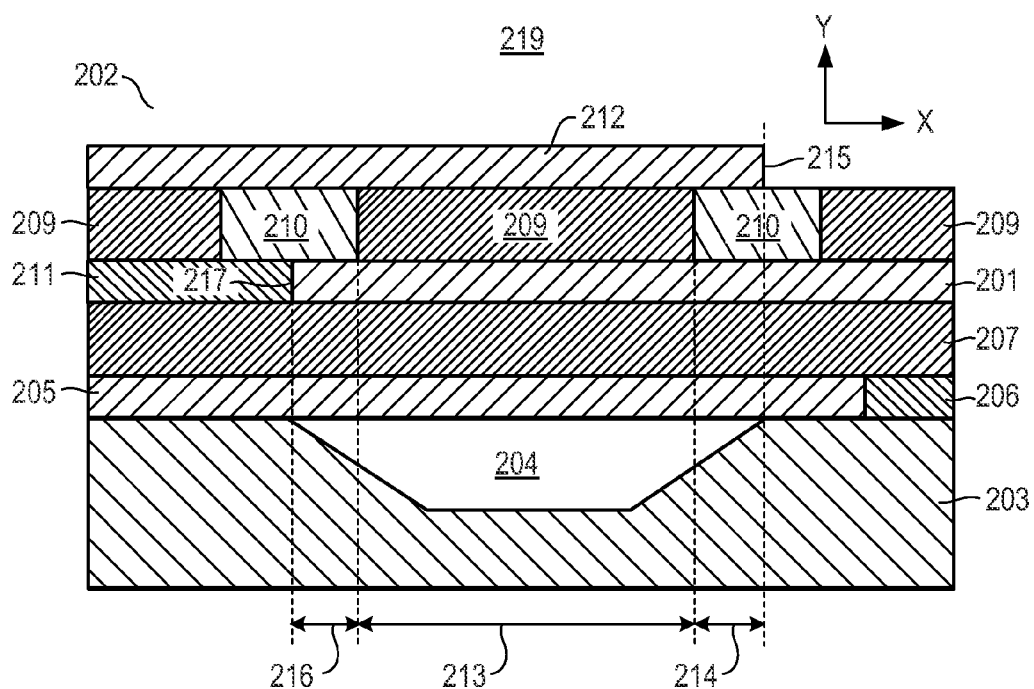

FIGS. 2A~2C are cross-sectional views of a double bulk acoustic resonator (DBAR) in accordance with representative embodiments. Many details of the present embodiments are common to those described above in connection with the representative embodiments of FIGS. 1A-1C. Generally, the common details are not repeated in the description of embodiments comprising a DBAR.

FIG. 2A is a cross-sectional view of a DBAR 200 in accordance with a representative embodiment. A substrate 203 comprises a cavity 204 or other acoustic reflector (e.g., a distributed Bragg grating (DBR) (not shown)). A first electrode 205 is disposed over the substrate 203 and is suspended over the cavity 204. A first planarization layer 206 is provided over the substrate 203 and may be non-etchable borosilicate glass (NEBSG). The first planarization layer serves to improve the quality of growth of subsequent layers (e.g., highly textured c-axis piezoelectric material), improve the performance of the DBAR 200 through the reduction of "dead" resonator (DBAR) regions and simplify the fabrication of the various layers of the DBAR 200.

A first piezoelectric layer 207 is provided over the first electrode 205, and comprises highly-textured c-axis piezoelectric material such as aluminum nitride (AlN) or zinc oxide (ZnO). The c-axis of the first piezoelectric layer 207 is in a first direction (e.g., parallel to the +y-direction in the coordinate system depicted). Adjacent to the first piezoelectric layer 207 is a second piezoelectric layer 208. The second piezoelectric layer 208 is typically made from the same substance as the first piezoelectric layer 207 (e.g., AlN or ZnO) but has a second c-axis oriented in a second direction that is substantially antiparallel (e.g., −y direction in the coordinate system depicted in FIG. 2A) to the first direction. The second electrode 201 is disposed over the first piezoelectric layer 207 and over the second piezoelectric layer 208. The second planarization layer 211 is disposed over the first and second piezoelectric layer 207, 208, and abuts the second electrode 201.

A third piezoelectric layer 209 is disposed over the second electrode 201 and the second planarization layer 211. Adjacent to the third piezoelectric layer 209 is a fourth piezoelectric layer 210. The third and fourth piezoelectric layers are typically made from the same substance as the first and second piezoelectric layer 207, 208 (e.g., AlN or ZnO) and have antiparallel c-axes. In particular, the c-axis of the third piezoelectric layer 209 is substantially parallel to the c-axis of the first piezoelectric layer 207, and the fourth piezoelectric layer 210 is substantially parallel to the c-axis of the second piezoelectric layer 208.

In accordance with representative embodiments, the second piezoelectric layer 208 has a piezoelectric coupling coefficient ($e_{33ip}$) in a range between approximately −0.1 (negative 0.1) times a piezoelectric coupling coefficient ($e_{33p}$) of the first piezoelectric layer 207 and approximately −2 (negative 2) times a piezoelectric coupling coefficient ($e_{33p}$) of the first piezoelectric layer 107. Similarly, the fourth piezoelectric layer 210 has a piezoelectric coupling coefficient ($e_{33ip}$) in a range between approximately −0.1 (negative 0.1) times a piezoelectric coupling coefficient ($e_{33p}$) of the third piezoelectric layer 209 and approximately −2 (negative 2) times a piezoelectric coupling coefficient ($e_{33p}$) of the third piezoelectric layer 209. In certain embodiments, therefore, the magnitude of the piezoelectric coupling coefficient ($e_{33p}$) of the first piezoelectric layer is substantially equal in magnitude but opposite sign of the coefficient ($e_{33ip}$) of the second piezoelectric layer (i.e., $e_{33ip}=(-1)\, e_{33p}$). Moreover, in certain representative embodiments, the piezoelectric coupling coefficients ($e_{33p}$) of the first and third piezoelectric layers 207, 209 are substantially identical, and the piezoelectric coupling coefficients ($e_{33ip}$) of the second and fourth piezoelectric layers 208, 210 are substantially identical. In other representative embodiments the piezoelectric coupling coefficients ($e_{33p}$) of the first and third piezoelectric layers 207, 209 are substantially identical, but the piezoelectric coupling coefficients ($e_{33ip}$) of the second and fourth piezoelectric layers 208, 210 can be substantially different. The difference between the second and the fourth piezoelectric layers 208, 210 may be beneficially needed to account for different layouts between first, second the third electrodes 205, 201 and 212, for example. Also, the difference between the second and the fourth piezoelectric layers 208, 210 may be beneficially needed to account for vertical stack asymmetry of DBAR 200, for another example.

A second planarization layer 211 is provided over the first piezoelectric layer 207 and the second piezoelectric layer 208 as depicted. Like the first planarization layer 206, the second planarization layer 211 is illustratively non-etchable borosilicate glass (NEBSG), and does not need to be present in the structure. However, the second planarization layer 211 may improve the quality of growth of subsequent layers (e.g., highly textured c-axis piezoelectric material), improve the performance of the DBAR 200 through the reduction of "dead" resonator (DBAR) regions and simplify the fabrication of the various layers of the DBAR 200.

A third electrode 212 is disposed over the third piezoelectric layer 209 and the fourth piezoelectric layer 210. On a connection side 202, the third electrode 212 extends over the fourth piezoelectric layer 210, and on all other sides of the DBAR 200, the third electrode 212 overlaps the second and fourth piezoelectric layers 208, 210 by a predetermined width described below. Similarly, the second electrode 201 overlaps the second and fourth piezoelectric layers 208, 210 by another predetermined width.

The overlap of the cavity 204, the first electrode 205, the first piezoelectric layer 207, the second electrode 201, the third piezoelectric layer 209 and the third electrode 212 defines an active region 213 of the DBAR 200. Acoustic losses at the boundaries of DBAR 200 are mitigated to improve mode confinement in the active region 213. In particular, the width of an overlap 214 of the third electrode 212 and the second and fourth (ip) piezoelectric layers 208, 210 is selected to reduce acoustic losses at termination edge 215 of the third electrode 212 by reducing scattering of acoustic energy at the termination by the selection of the relative values of the piezoelectric coefficients ($e_{33p}$, $e_{33ip}$) of the first through fourth piezoelectric layers 207~210. Similarly, a width of the overlap 216 of a termination edge 217 of the second electrode 201 and the second and fourth (ip) piezoelectric layers 208, 210 may be selected to reduce acoustic losses at the termination edge 217 of the second electrode 201 by reducing scattering of acoustic energy at the termination by the selection of the relative values of the piezoelectric coefficients ($e_{33p}$, $e_{33ip}$) of the first through fourth piezoelectric layers 207~210.

In the embodiment depicted in FIG. 2A, the second piezoelectric layer 208 is disposed between layers of the first piezoelectric layer 207, and the fourth piezoelectric layer 210 is disposed between layers of the third piezoelectric layer 209 (i.e., the second piezoelectric layer 208 and the fourth piezoelectric layer 210 form "rings" between the first piezoelectric layer 207 and the third piezoelectric layer 209, respectively.) It is noted that the second piezoelectric layer 208 may extend from the interface with the first piezoelectric layer 207 (i.e., at the edge of the active region 213) and the fourth piezoelectric layer 210 may extend from the interface with the third piezoelectric layer 209 (i.e., at the edge of the active region 213). As such, the second piezoelectric layer 208 and the fourth piezoelectric layer 210 are "unbounded." Accordingly, in such an embodiment, the first piezoelectric layer 207 and the third piezoelectric layer 209 are provided only in the active region 213.

FIG. 2B is a cross-sectional view of a DBAR 218 in accordance with a representative embodiment. Many details of materials, methods of manufacture and specifications of the DBAR 218 are common to those described in connection with DBAR 200. Many of these common details are not often repeated.

The substrate 203 comprises cavity 204. The first electrode 205 is disposed over the substrate 203 and is suspended over the cavity 204. The first planarization layer 206 is provided over the substrate 203. The first piezoelectric layer 207 is provided over the first electrode 205, and comprises highly-textured c-axis piezoelectric material such as aluminum nitride (AlN) or zinc oxide (ZnO). Adjacent to the first piezoelectric layer 207 is second piezoelectric layer 208. The second piezoelectric layer 208 is typically made from the same substance as the first piezoelectric layer 207 (e.g., AlN or ZnO) but has a second c-axis oriented in a second direction that is substantially antiparallel (e.g., −y direction in the coordinate system depicted in FIG. 2B) to the first direction. The second electrode 201 and the second planarization layer 211 are disposed over the first piezoelectric layer 207 and over the second piezoelectric layer 208.

The third piezoelectric layer 209 is disposed over the second electrode 201. The second planarization layer 211 is provided over the first piezoelectric layer 207 and the second piezoelectric layer 208 as depicted. Unlike the embodiment depicted in FIG. 2A, there is no fourth piezoelectric layer 210 provided in the DBAR 218. The third electrode 212 is disposed over the third piezoelectric layer 209. On the connection side 202, the third electrode 212 extends over the third piezoelectric layer 209. On all other sides of the DBAR 218, the third electrode 212 overlaps the second piezoelectric layer 208 by a predetermined width described below. Similarly, the second electrode 201 overlaps the second piezoelectric layer 208 by a predetermined width.

The overlap of the cavity 204, the first electrode 205, the first piezoelectric layer 207, the second electrode 201, the third piezoelectric layer 209 and the third electrode 212 defines an active region 213 of the DBAR 218. Acoustic losses at the boundaries of DBAR 218 are mitigated to improve mode confinement in the active region 213. In particular, the width of the overlap 214 of the third electrode 212 and the second piezoelectric layer 208 is selected to reduce acoustic losses to improve mode confinement in the active region 213. Beneficially, the width of an overlap 214 of the third electrode 212 and the second piezoelectric layer 208 is selected to reduce acoustic losses at termination edge 215 of the third electrode 212 by reducing scattering of acoustic energy at the termination edge 215 by the selection of the relative values of the piezoelectric coefficients ($e_{33p}$, $e_{33ip}$) of the first, third piezoelectric layers 207~209. Similarly, a width of the overlap 216 of the second electrode 201 and the second piezoelectric layer 208 may be selected to reduce acoustic losses at the termination edge 217 of the second electrode 201 by reducing scattering of acoustic energy at the termination by the selection of the relative values of the piezoelectric coefficients ($e_{33p}$, $e_{33ip}$) of the first, second and third piezoelectric layers 207, 208 and 209.

In the embodiment depicted in FIG. 2B, the second piezoelectric layer 208 is disposed between layers of the first piezoelectric layer 207 (i.e., the second piezoelectric layer 208 forms a "ring" in the first piezoelectric layer 207). It is noted that the second piezoelectric layer 208 may extend from the interface with the first piezoelectric layer 207 (i.e., at the edge of the active region 213). As such, the first piezoelectric layer 207 is provided only in the active region 213 and the second piezoelectric layer 208 is "unbounded."

FIG. 2C is a cross-sectional view of a DBAR 219 in accordance with a representative embodiment. The substrate 203 comprises cavity 204. The first electrode 205 is disposed over the substrate 203 and is suspended over the cavity 204. The first planarization layer 206 is provided over the substrate 203 and abuts the first electrode 205. The first piezoelectric layer 207 is provided over the first electrode 205, and comprises highly-textured c-axis piezoelectric material such as aluminum nitride (AlN) or zinc oxide (ZnO). Unlike the embodiment depicted in FIGS. 2A and 2B, there is no second piezoelectric layer 208 in the DBAR 219.

The third piezoelectric layer 209 is disposed over the second electrode 201 and the second planarization layer 211. Adjacent to the third piezoelectric layer 209 is the fourth piezoelectric layer 210. The third electrode 212 is disposed over the third piezoelectric layer 209 and the fourth piezoelectric layer 210. On the connection side 202, the third electrode 212 extends over the third piezoelectric layer 209 and the fourth piezoelectric layer 210 as depicted. The third electrode 212 overlaps the fourth piezoelectric layer 210 by a predetermined width described below. Similarly, the second electrode 201 overlaps the fourth piezoelectric layer 210 by another predetermined width.

The overlap of the cavity 204, the first electrode 205, the first piezoelectric layer 207, the second electrode 201, the second piezoelectric layer 209 and the third electrode 212 defines the active region 213 of the DBAR 219. Beneficially, acoustic losses at the boundaries of DBAR 219 are mitigated to improve mode confinement in the active region 213. In particular, the width of the overlap 214 of the third electrode 212 and the fourth (ip) piezoelectric layer 210 is selected to reduce acoustic losses at termination edge 215 of the third electrode 212 by reducing scattering of acoustic energy at the termination edge 215 by the selection of the relative values of the piezoelectric coefficients ($e_{33p}$, $e_{33ip}$) of the first through fourth piezoelectric layers 207~210. Similarly, a width of the overlap 216 of the second electrode 201 and the fourth piezoelectric layer 210 may be selected to reduce acoustic losses at the termination edge 217 of the second electrode 201 by reducing scattering of acoustic energy at the termination by the selection of the relative values of the piezoelectric coefficients ($e_{33p}$, $e_{33ip}$) of the first, second and fourth piezoelectric layers 207, 208 and 209.

In the embodiment depicted in FIG. 2C, the fourth piezoelectric layer 210 is disposed between layers of the third piezoelectric layer 209 (i.e., the fourth piezoelectric layer 210 forms a "ring" in the third piezoelectric layer 209). It is noted that the fourth piezoelectric layer 210 may extend from the interface with the third piezoelectric layer 209 (i.e., at the edge of the active region 213). As such, the third piezoelectric layer 209 can be provided only in the active region 213 and the fourth piezoelectric layer 210 is "unbounded."

Figure 2D:
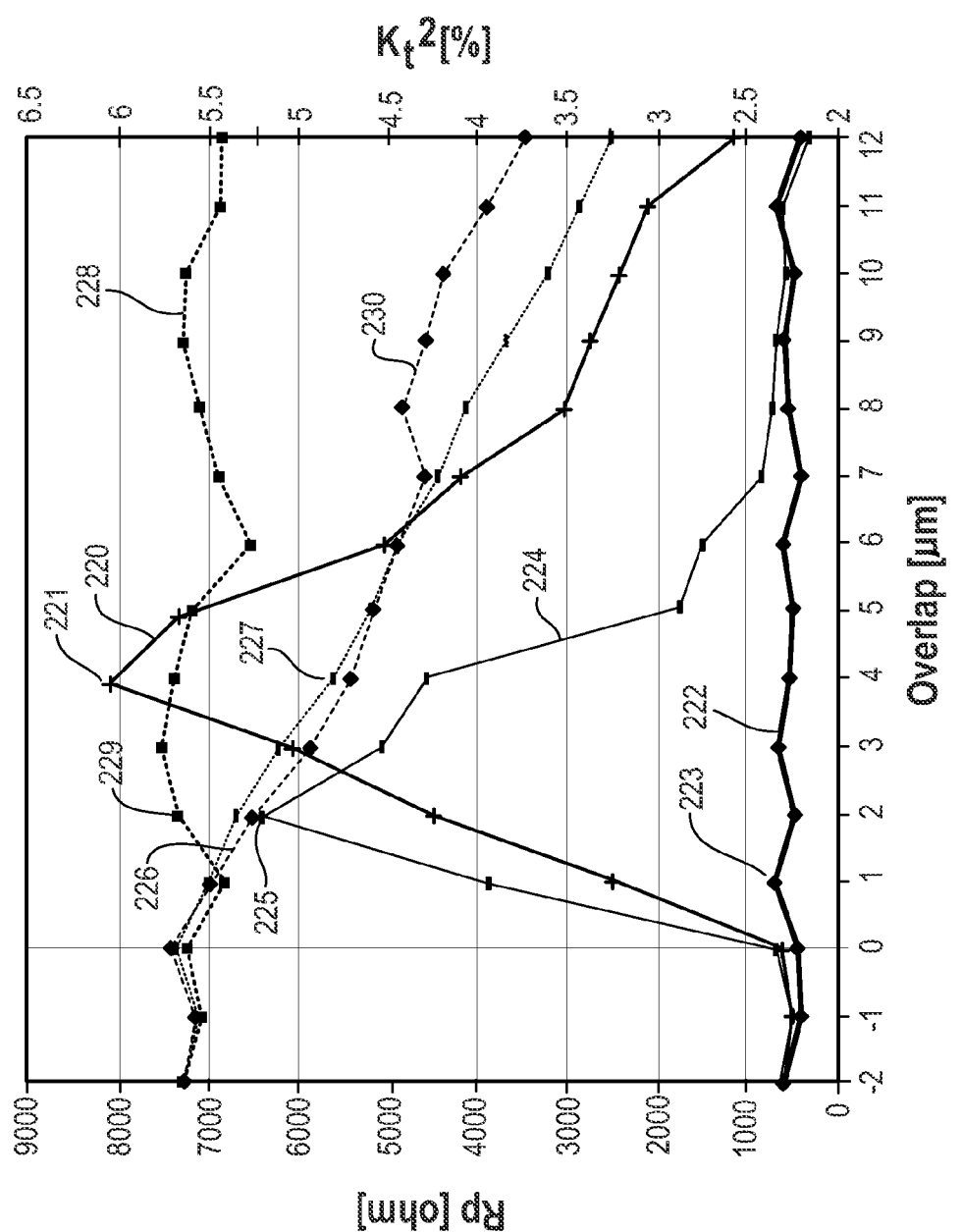
FIG. 2D is a graph showing the parallel impedance (Rp) (left axis) and the electro-mechanical coupling coefficient ($kt^2$) (right axis) versus width of an overlap of an electrode and a non-piezoelectric layer of a DBAR in accordance with a representative embodiment.

FIG. 2D is a graph showing the simulated parallel impedance (Rp) (left axis) and the electro-mechanical coupling coefficient ($kt^2$) (right axis) versus width of an overlap of an electrode (e.g., third electrode 212) and an inverse piezoelectric layer (e.g., second or fourth piezoelectric layers 208, 210) of a DBAR (e.g., DBAR 200) in accordance with a representative embodiment. Inverse piezoelectric layers (e.g., second and fourth piezoelectric layer 208, 210) having the same piezoelectric coupling coefficients ($e_{33ip}$) for a range of values of $e_{33ip}$ are depicted over a range of overlap values (e.g., overlap 110) of second electrode 101.

Curve 220 depicts Rp for a DBAR wherein $e_{33ip}=(-0.5)$ $e_{33p}$ (e.g., for second and fourth piezoelectric layers 208, 210). At point 221, where the overlap is approximately 3.5 µm, Rp is approximately 8000Ω. By comparison, graph 222 depicts the Rp a DBAR in which $e_{33ip}=e_{33p}$ (i.e., no ip-layer) which exhibits a peak Rp at point 223 of approximately 800Ω, at an overlap of approximately 1.0 µm. Curve 224 depicts Rp for an FBAR wherein $e_{33ip}=(-1.0)$ $e_{33p}$. At point 225, the maximum Rp for this combination is approximately 6500Ω.

As noted above in connection of the description of FIGS. 2A~2C, the combination of the overlap 214 of the third electrode 212 with the second and fourth piezoelectric layers 208, 210, and the selection of the magnitude of $e_{33ip}$ relative to $e_{33p}$ influences the resultant total field displacement Uz at certain points of the DBAR 200, 218 and 219. Notably, the selection of the overlap 214 and the relative piezoelectric coupling coefficients can result in different amplitudes of the resultant total field displacement Uz at certain scattering locations (e.g., termination edge 215 of the DBAR 215). So, from the data presented in FIG. 2D, minimal scattering is realized by the selection of $e_{33ip}=(-0.5)$ $e_{33p}$, and overlap of approximately 3.5 to provide maximum Rp. As noted in connection with FIG. 1F for FBAR 113 and explained qualitatively in connection with FIGS. 1D-1E, the case of $e_{33ip}=(-0.5)$ $e_{33p}$ is beneficial over the case $e_{33ip}=(-1)$ $e_{33p}$ for high Q designs because of more complete suppression of mechanical motion at the termination edges 215 and 217 in DBAR 200.

Curve 226 depicts the electro-mechanical coupling coefficient ($kt^2$) versus overlap 21 in which $e_{33ip}=(-0.5)$ $e_{33p}$. At point 227, which corresponds to an overlap of approximately 3.5 µm and maximum Rp, $kt^2$ is approximately 4.75%. Curve 228 depicts the electro-mechanical coupling coefficient ($kt^2$) versus overlap 216 in which $e_{33ip}=e_{33p}$. By comparison to the overlap for maximum Rp, at point 229 $kt^2$ is approximately 5.75%. At point 230, which corresponds to an overlap of approximately 1.0 µm and maximum Rp, $kt^2$ is approximately 5.5%. The mechanism responsible for reduction of the electromechanical coupling coefficient ($kt^2$) in DBAR 200 compared to a known DBAR is the same as described for FBARs 100 and 113 in relation to FIG. 1F and will not be repeated here for a brevity of the presentation.

Embodiments Comprising a Coupled Resonator Filter (CRF)

Figure 3A:
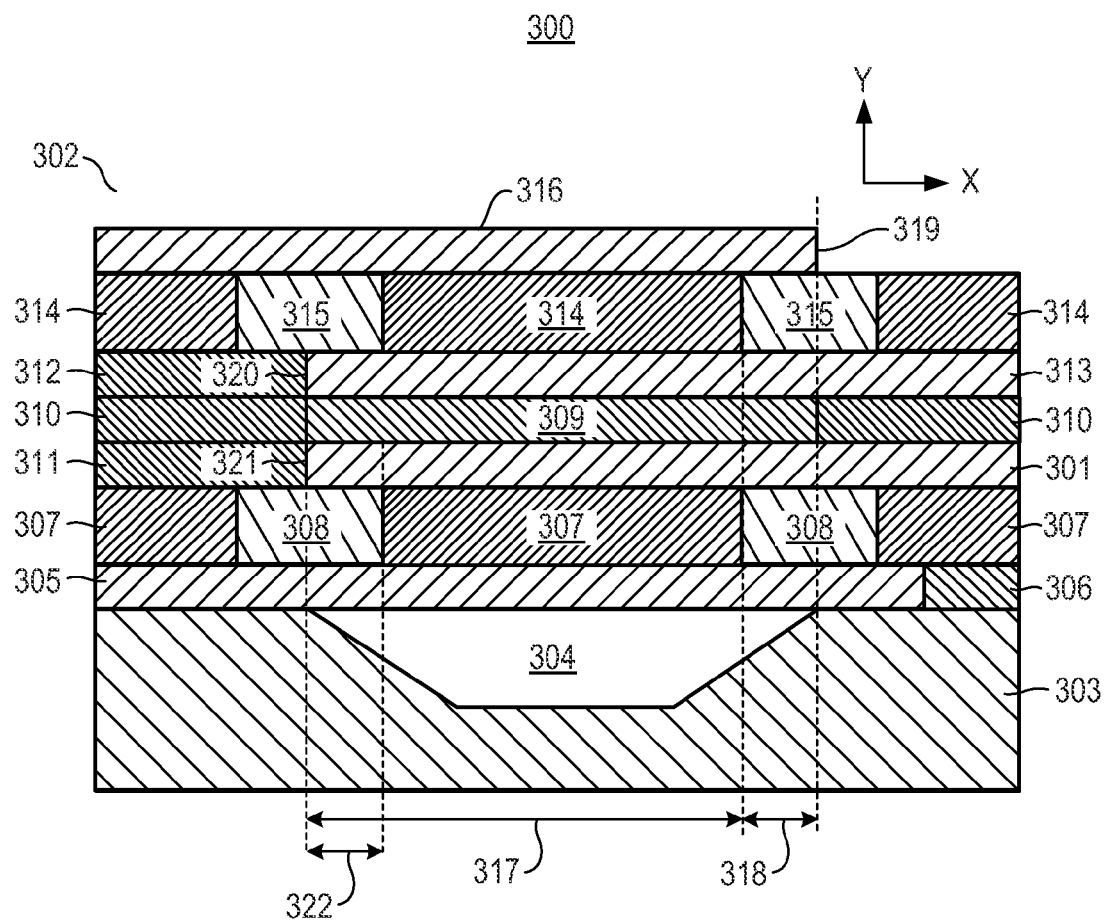
FIGS. 3A-3C are cross-sectional views of coupled resonator filters (CRFs) in accordance with representative embodiments.
Figure 3B:
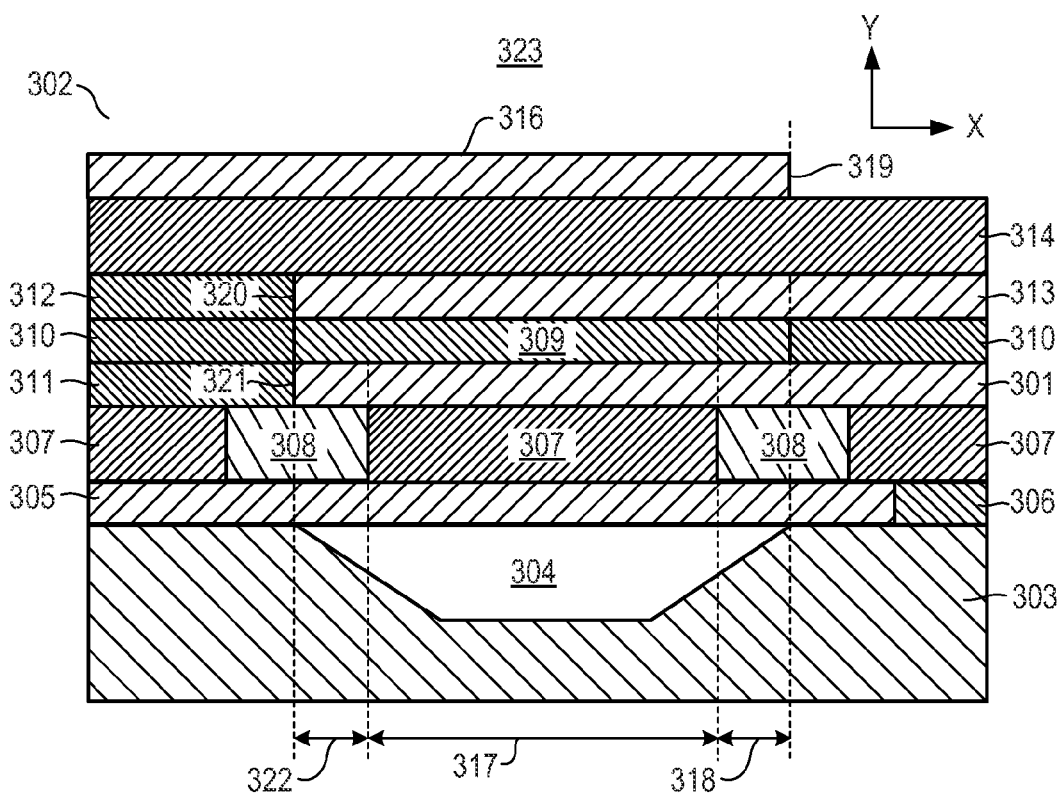
Figure 3C:
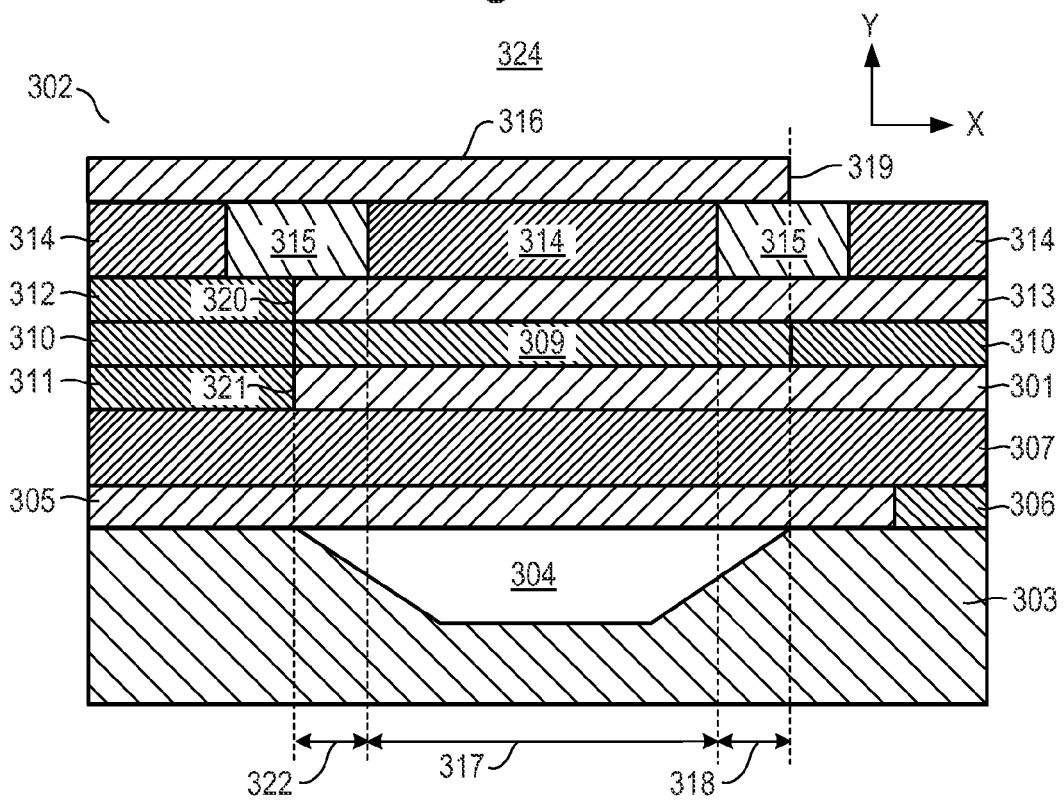

FIGS. 3A~3C are cross-sectional views of a coupled resonator filter (CRF) in accordance with representative embodiments. Many details of the present embodiments including materials, methods of fabrication and dimensions, are common to those described above in connection with the representative embodiments of FIGS. 1A-2D. Generally, the common details are not repeated in the description of embodiments comprising a CRF.

FIG. 3A is a cross-sectional view of a CRF 300 in accordance with a representative embodiment. A substrate 303 comprises a cavity 304 or other acoustic reflector (e.g., a distributed Bragg grating (DBR) (not shown)). A first electrode 305 is disposed over the substrate 303 and is suspended over a cavity 304. A first planarization layer 306 is provided over the substrate 303 and may be non-etchable borosilicate glass (NEBSG) as described above. The first planarization layer 306 serves to improve the quality of growth of subsequent layers (e.g., highly textured c-axis piezoelectric material), improve the performance of the CRF 300 through the reduction of "dead" resonator (CRF) regions and simplify the fabrication of the various layers of the CRF 300.

A first piezoelectric layer 307 is provided over the first electrode 305, and comprises highly-textured c-axis piezoelectric material such as aluminum nitride (AlN) or zinc oxide (ZnO). The c-axis of the first piezoelectric layer 307 is in a first direction (e.g., parallel to the +y-direction in the coordinate system depicted). Adjacent to the first piezoelectric layer 307 is a second piezoelectric layer 308. The second piezoelectric layer 308 is typically made from the same substance as the first piezoelectric layer 307 (e.g., AlN or ZnO) but has a second c-axis oriented in a second direction that is substantially antiparallel (e.g., -y direction in the coordinate system depicted in FIG. 3A) to the first direction. A second electrode 301 is disposed over the first and second piezoelectric layers 307, 308 as depicted in FIG. 3A.

An acoustic coupling layer ("coupling layer") 309 is disposed over the second electrode 301. A second planarization layer 310 is disposed over a third planarization layer 311 and over the second electrode 301. The third planarization layer 311 abuts the sides of the acoustic coupling layer 309 as depicted in FIG. 3A.

The coupling layer 309 illustratively comprises carbon doped oxide (CDO), or NEBSG, or carbon-doped silicon oxide (SiOCH) such as described in commonly owned U.S. patent application Ser. No. 12/710,640, entitled "Bulk Acoustic Resonator Structures Comprising a Single Material Acoustic Coupling Layer Comprising Inhomogeneous Acoustic Property" to Elbrecht, et al. and filed on Feb. 23, 2010. The disclosure of this patent application is specifically incorporated herein by reference. Notably, SiOCH films of the representative embodiment belong to a general class of comparatively low dielectric constant (low-k) dielectric materials often referred to as carbon-doped oxide (CDO). Alternatively, the coupling layer 309 may comprise other dielectric materials with suitable acoustic impedance and acoustic attenuation, including, but not limited to porous silicon oxynitride (SiON); porous boron doped silicate glass (BSG); or porous phosphosilicate glass (PSG). Generally, the material used for the coupling layer 309 is selected to provide comparatively low acoustic impedance and loss in order to provide desired pass-band characteristics.

A third electrode 313 is disposed over the coupling layer 309 and the second planarization layer 310 and abuts a fourth planarization layer 312 as depicted in FIG. 3A. A third piezoelectric layer 314 is disposed over the third electrode 313. Adjacent to the third piezoelectric layer 314 is a fourth piezoelectric layer 315. The third and fourth piezoelectric layers 314, 315 each comprise a highly-textured c-axis piezoelectric material such as aluminum nitride (AlN) or zinc oxide (ZnO). The c-axis of the third piezoelectric layer 314 is in a first direction (e.g., parallel to the +y-direction in the coordinate system depicted). The fourth piezoelectric layer 315 is typically made from the same material as the third piezoelectric layer 314 (e.g., AlN or ZnO) but has a second c-axis oriented in a second direction that is substantially antiparallel (e.g., -y direction in the coordinate system depicted in FIG. 3A) to the first direction.

A fourth electrode 316 is disposed over the third piezoelectric layer 314, and the fourth piezoelectric layer 315. On a connection side 302, the fourth electrode 316 extends over third piezoelectric layer 314, and the fourth piezoelectric layer 315. On all other sides of the CRF 300, the fourth electrode 316 overlaps the second and fourth piezoelectric layers 308, 315 by a predetermined width described below. Also, the second and third electrodes 301, 313 may overlap the second and fourth piezoelectric layers 308, 315 by other predetermined widths as described below.

The overlap of the cavity 304, the first electrode 305, the first piezoelectric layer 307, the second electrode 301, the coupling layer 309, the third electrode 313, the third piezoelectric layer 314 and the fourth electrode 316 defines an active region 317 of the CRF 300. In representative embodiments described below, acoustic losses at the boundaries of CRF 300 are mitigated to improve mode confinement in the active region 317. In particular, the width of an overlap 318 of the fourth electrode 316 and the second and fourth piezoelectric layers 308, 315 is selected to reduce acoustic losses at termination edge 319 of the fourth electrode 316 by reducing scattering of acoustic energy at the termination by the selection of the relative values of the piezoelectric coefficients ($e_{33p}$, $e_{33ip}$) of the first through fourth piezoelectric layers 307, 308, 314 and 315. Similarly, the width of an overlap 322 of the second and third electrodes 301 and 313, and the second and fourth piezoelectric layers 308, 315 is selected to reduce acoustic losses at termination edges 320, 321 of the second and third electrodes 301, 313 by reducing scattering of acoustic energy by the selection of the relative values of the piezoelectric coefficients ($e_{33p}$, $e_{33ip}$) of the first through fourth piezoelectric layers 307, 308, 314 and 315. It should be emphasized that due to complexity of the diffraction phenomena involved in piston mode formation in CRF 300, simple prediction of most optimum width of the overlap 318 is usually not possible and has to be done numerically, and, ultimately, must be determined experimentally.

In the embodiment depicted in FIG. 3A, the second piezoelectric layer 308 is disposed between layers of the first piezoelectric layer 307, and the fourth piezoelectric layer 315 is disposed between layers of the third piezoelectric layer 314. It is noted that the second piezoelectric layer 308 may extend from the interface with the first piezoelectric layer 307 (i.e., at the edge of the active region 317) and the fourth piezoelectric layer 315 may extend from the interface with the third piezoelectric layer 314 (i.e., at the edge of the active region 317). As such, the first piezoelectric layer 307 and the third piezoelectric layer 314 are provided only in the active region 317, and the second and fourth piezoelectric layers 308, 315 are unbounded.

FIG. 3B is a cross-sectional view of a CRF 323 in accordance with a representative embodiment. The substrate 303 comprises cavity 304. The first electrode 305 is disposed over the substrate 303 and is suspended over the cavity 304. The first planarization layer 306 is provided over the substrate 303 and may be non-etchable borosilicate glass (NEBSG) as described above. The first planarization layer 306 serves to improve the quality of growth of subsequent layers (e.g., highly textured c-axis piezoelectric material), improve the performance of the CRF 300 through the reduction of "dead" resonator (CRF) regions and simplify the fabrication of the various layers of the CRF 300.

A first piezoelectric layer 307 is provided over the first electrode 305, and comprises highly-textured c-axis piezoelectric material such as aluminum nitride (AlN) or zinc oxide (ZnO). The c-axis of the first piezoelectric layer 307 is in a first direction (e.g., parallel to the +y-direction in the coordinate system depicted). Adjacent to the first piezoelectric layer 307 is a second piezoelectric layer 308. The second piezoelectric layer 308 is typically made from the same substance as the first piezoelectric layer 307 (e.g., AlN or ZnO) but has a second c-axis oriented in a second direction that is substantially antiparallel (e.g., -y direction in the coordinate system depicted in FIG. 3A) to the first direction. A second electrode 301 and the third planarization layer 311 are disposed over the first piezoelectric layer 307 and over the second piezoelectric layer 308.

Coupling layer 309 is disposed over the second electrode 301, and adjacent to the second planarization layer 310. The coupling layer 309 illustratively comprises carbon doped oxide (CDO), or NEBSG, or carbon-doped silicon oxide (SiOCH) such as described in the commonly owned referenced U.S. Patent Application to Elbrecht, et al. Alternatively, the coupling layer 309 may comprise other dielectric materials with suitable acoustic impedance and acoustic attenuation, including, but not limited to porous silicon oxynitride (SiON); porous boron doped silicate glass (BSG); or porous phosphosilicate glass (PSG). Generally, the material used for the coupling layer 309 is selected to provide comparatively low acoustic impedance and loss in order to provide desired pass-band characteristics.

The third electrode 313 is disposed over the coupling layer 309 and the second planarization layer 310 and abuts the fourth planarization layer 312 as depicted in FIG. 3B. The third piezoelectric layer 314 is disposed over the third electrode 313. Unlike the embodiment depicted in FIG. 3A, there is no fourth piezoelectric layer 315 in the CRF 324.

The fourth electrode 316 is disposed over the third piezoelectric layer 314. On a connection side 302, the fourth electrode 316 extends over third piezoelectric layer 314. On all other sides of the CRF 300, the fourth electrode 316 overlaps the second piezoelectric layer 308 by a predetermined width described below. Also, the second and third electrodes 301, 313 may overlap the second piezoelectric layer 308 by other predetermined widths.

The overlap of the cavity 304, the first electrode 305, the first piezoelectric layer 307, the second electrode 301, the coupling layer 309, the third electrode 313, the third piezoelectric layer 314 and the fourth electrode 316 defines an active region 317 of the CRF 324. In representative embodiments described below, acoustic losses at the boundaries of CRF 300 are mitigated to improve mode confinement in the active region 317. In particular, the width of the overlap 318 of the fourth electrode 316 and the second piezoelectric layer 308 is selected to reduce acoustic losses at termination edge 319 of the fourth electrode 316 by reducing scattering of acoustic energy at the termination by the selection of the relative values of the piezoelectric coefficients ($e_{33p}$, $e_{33ip}$) of the first through third piezoelectric layers 307,308 and 314. Similarly, the width of the overlap 322 of the second and third electrodes 301 and 313, and the second piezoelectric layer 308 is selected to reduce acoustic losses at termination edges 320, 321 of the second and third electrodes 301, 313 by reducing scattering of acoustic energy by the selection of the relative values of the piezoelectric coefficients ($e_{33p}$, $e_{33ip}$) of the first, second and third piezoelectric layers 307, 308 and 314. It should be emphasized that due to complexity of the diffraction phenomena involved in piston mode formation in CRF 324, simple prediction of most optimum width of the overlap 318 is usually not possible and has to be done numerically, and, ultimately, must be determined experimentally.

In the embodiment depicted in FIG. 3B, the second piezoelectric layer 308 is disposed between layers of the first piezoelectric layer 307. It is noted that the second piezoelectric layer 308 may extend from the interface with the first piezoelectric layer 307 (i.e., at the edge of the active region 317). As such, the first piezoelectric layer 307 and the third piezoelectric layer 314 are provided only in the active region 317, and the second piezoelectric layer 308 is unbounded.

FIG. 3C is a cross-sectional view of a CRF 324 in accordance with a representative embodiment. The substrate 303 comprises cavity 304. The first electrode 305 is disposed over the substrate 303 and is suspended over the cavity 304. The first planarization layer 306 is provided over the substrate 303 and may be non-etchable borosilicate glass (NEBSG) as described above. The first planarization layer 306 serves to improve the quality of growth of subsequent layers (e.g., highly textured c-axis piezoelectric material), improve the performance of the CRF 300 through the reduction of "dead" resonator (CRF) regions and simplify the fabrication of the various layers of the CRF 300.

A first piezoelectric layer 307 is provided over the first electrode 305, and comprises highly-textured c-axis piezoelectric material such as aluminum nitride (AlN) or zinc oxide (ZnO). The c-axis of the first piezoelectric layer 307 is in a first direction (e.g., parallel to the +y-direction in the coordinate system depicted). Unlike the embodiment depicted in FIGS. 3A and 3B, there is no second piezoelectric layer 308 in the CRF 324. A second electrode 301 is disposed over the first piezoelectric layer 307 and over the second piezoelectric layer 308 and abuts the third planarization layer 311 as depicted in FIG. 3C.

Coupling layer 309 is disposed over the second electrode 301, and adjacent to the second planarization layer 310. The coupling layer 309 illustratively comprises carbon doped oxide (CDO), or NEBSG, or carbon-doped silicon oxide (SiOCH) such as described in the commonly owned referenced U.S. Patent Application to Elbrecht, et al. Alternatively, the coupling layer 309 may comprise other dielectric materials with suitable acoustic impedance and acoustic attenuation, including, but not limited to porous silicon oxynitride (SiON); porous boron doped silicate glass (BSG); or porous phosphosilicate glass (PSG). Generally, the material used for the coupling layer 309 is selected to provide comparatively low acoustic impedance and loss in order to provide desired pass-band characteristics.

The third electrode 313 is disposed over the coupling layer 309 and the second planarization layer 310 and abuts the fourth planarization layer 312 as depicted in FIG. 3C. The third piezoelectric layer 314 is disposed over the third electrode 313. Adjacent to the third piezoelectric layer 314 is a fourth piezoelectric layer 315. The third and fourth piezoelectric layers 314, 315 each comprise a highly-textured c-axis piezoelectric material such as aluminum nitride (AlN) or zinc oxide (ZnO). The c-axis of the third piezoelectric layer 314 is in a first direction (e.g., parallel to the +y-direction in the coordinate system depicted). The fourth piezoelectric layer 315 is typically made from the same substance as the third piezoelectric layer 314 (e.g., AlN or ZnO) but has a second c-axis oriented in a second direction that is substantially antiparallel (e.g., -y direction in the coordinate system depicted in FIG. 3A) to the first direction.

The fourth electrode 316 is disposed over the third piezoelectric layer 314 and the fourth piezoelectric layer 315. On a connection side 302, the fourth electrode 316 extends over third and fourth piezoelectric layers 314, 315. On all other sides of the CRF 300, the fourth electrode 316 overlaps the fourth piezoelectric layer 315 by a predetermined width described below. Also, the second and third electrodes 301, 313 may overlap the fourth piezoelectric layer 315 by other predetermined widths.

The overlap of the cavity 304, the first electrode 305, the first piezoelectric layer 307, the second electrode 301, the coupling layer 309, the third electrode 313, the third piezoelectric layer 314 and the fourth electrode 316 defines an active region 317 of the CRF 324. In representative embodiments described below, acoustic losses at the boundaries of CRF 324 are mitigated to improve mode confinement in the active region 317. In particular, the width of an overlap 318 of the fourth electrode 316 and the fourth piezoelectric layer 315 is selected to reduce acoustic losses at termination edge 319 of the fourth electrode 316 by reducing scattering of acoustic energy at the termination by the selection of the relative values of the piezoelectric coefficients ($e_{33p}$, $e_{33ip}$) of the first, second and fourth piezoelectric layers 307, 308 and 315. Similarly, the width of the overlap 322 of the second and third electrodes 301 and 313, and the fourth piezoelectric layer 315 is selected to reduce acoustic losses at termination edges 320, 321 of the second and third electrodes 301, 313 by reducing scattering of acoustic energy by the selection of the relative values of the piezoelectric coefficients ($e_{33p}$, $e_{33ip}$) of the first, second and fourth piezoelectric layers 307, 308 and 315. It should be emphasized that due to complexity of the diffraction phenomena involved in piston mode formation in CRF 324, simple prediction of most optimum width of the overlap 318 is usually not possible and has to be done numerically, and, ultimately, must be determined experimentally.

In the embodiment depicted in FIG. 3C, the fourth piezoelectric layer 315 is disposed between layers of the third piezoelectric layer 314. It is noted that the fourth piezoelectric layer 315 may extend from the interface with the third piezoelectric layer 314 (i.e., at the edge of the active region 317). As such, the first piezoelectric layer 307 and the third piezoelectric layer 314 are provided only in the active region 317, and the fourth piezoelectric layer 315 is unbounded.

Figure 3D:
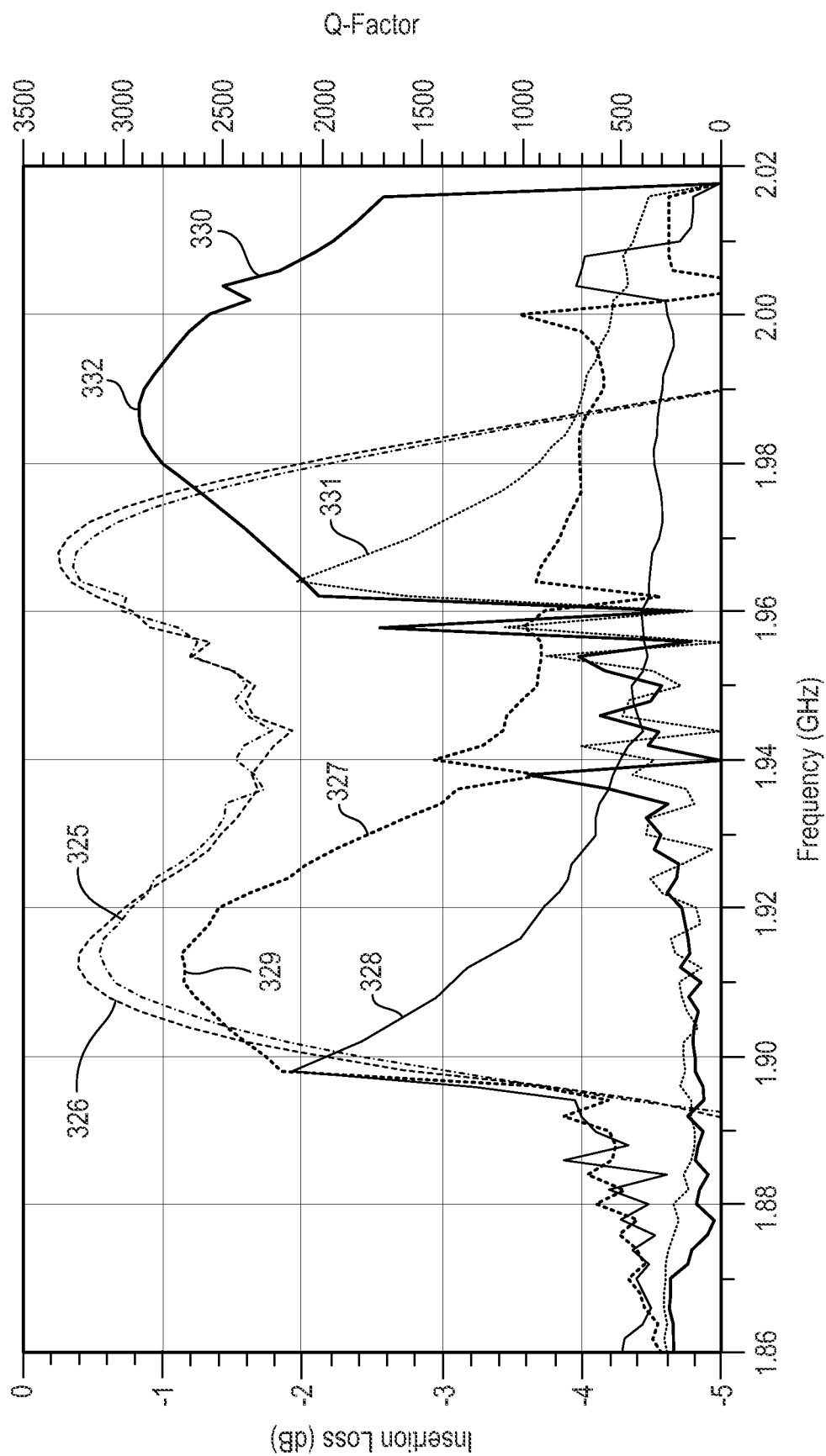
FIG. 3D is a graph of an insertion loss IL (left axis) and Q factor (right axis) of an odd mode ($Q_o$) and even mode ($Q_e$) versus frequency of a known CRF and a CRF in accordance with a representative embodiment.

FIG. 3D is a graph of a simulated insertion loss IL (left axis) and Q factor (right axis) of an odd mode ($Q_o$) and even mode ($Q_e$) versus frequency of a known CRF and a CRF in accordance with a representative embodiment. Notably, for the CRF of the representative embodiment, the piezoelectric coupling coefficients of the second and fourth piezoelectric layers (ip layers) 308, 315 are the same, and have opposite sign and one-half the magnitude of the piezoelectric layer of the first and third piezoelectric layers 307, 314 (p-layers) ($e_{33ip}=(-0.5)\ e_{33p}$). Moreover, the overlap 318 is approximately 2.0

Curve 325 depicts the insertion loss ($S_{21}$) of a known CRF, and curve 326 depicts the insertion loss ($S_{21}$) of a CRF (e.g., CRF 300) in accordance with a representative embodiment. As can be appreciated, an improvement in the insertion loss is realized by the CRF of the representative embodiment across its passband compared to the known CRF.

Curve 327 depicts the quality factor for the odd mode ($Q_o$) of the CRF of a representative embodiment, and curve 328 depicts $Q_o$ of the known CRF. At point 329 (approximately 1.91 GHz), $Q_o$ of the CRF of a representative embodiment is approximately 2700, which represents a significant (approximately 2 times) improvement over $Q_o$ of the known CRF.

Curve 330 depicts the quality factor for the even mode ($Q_e$) of the CRF of a representative embodiment, and curve 331 depicts $Q_e$ of the known CRF. At point 332 (approximately 1.99 GHz), $Q_e$ of the CRF of a representative embodiment is approximately 2900, which represents a significant (approximately 6 times) improvement over $Q_e$ of the known CRF.

In accordance with illustrative embodiments, BAW resonator structures comprising a piezoelectric and inverse piezoelectric layers and their methods of fabrication are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
a first electrode disposed over a substrate;
a first piezoelectric layer disposed over the first electrode, the first piezoelectric layer having a first c-axis oriented along a first direction;
a second piezoelectric layer disposed over the first electrode, wherein the second piezoelectric layer has a second c-axis oriented in a second direction that is substantially antiparallel to the first direction; and
a second electrode disposed over the first piezoelectric layer and over the second piezoelectric layer, the second electrode being in direct contact with the first piezoelectric and in direct contact with the second piezoelectric layer.

2. A BAW resonator structure as claimed in claim 1, wherein the second piezoelectric layer has a piezoelectric coupling coefficient ($e_{33ip}$) that is substantially equal in magnitude but opposite in sign of a piezoelectric coupling coefficient ($e_{33p}$) of the first piezoelectric layer.

3. A BAW resonator structure as claimed in claim 1, wherein the first piezoelectric layer and the second piezoelectric layer each comprise the same piezoelectric material having substantially identical elastic properties.

4. A BAW resonator structure as claimed in claim 3, wherein the piezoelectric material comprises one of aluminum nitride (AlN) and zinc oxide (ZnO).

5. A bulk acoustic wave (BAW) resonator structure, comprising:
a first electrode disposed over a substrate;
a first piezoelectric layer disposed over the first electrode, the first piezoelectric layer having a first c-axis oriented along a first direction;
a second electrode disposed over the first piezoelectric layer;
a second piezoelectric layer disposed over the first electrode and adjacent to the first piezoelectric layer, the second piezoelectric layer having a second c-axis oriented along a second direction that is substantially antiparallel to the first direction;
a third piezoelectric layer disposed over the second electrode, the third piezoelectric layer having a third c-axis oriented parallel to the first direction;
a third electrode disposed over the third piezoelectric layer;
a fourth piezoelectric layer disposed over the second electrode and adjacent to the third piezoelectric layer, the second piezoelectric layer having a fourth c-axis oriented parallel to the second direction.

6. A BAW resonator structure as claimed in claim 5, wherein the second piezoelectric layer has a piezoelectric coupling coefficient ($e_{33ip}$) in a range between approximately −0.1 times a piezoelectric coupling coefficient ($e_{33p}$) of the first piezoelectric layer and approximately −2 times a piezoelectric coupling coefficient ($e_{33p}$) of the first piezoelectric layer.

7. A BAW resonator as claimed in claim 6, wherein the second piezoelectric layer has a piezoelectric coupling coefficient ($e_{33ip}$) in a range between approximately −0.1 times a piezoelectric coupling coefficient ($e_{33p}$) of the first piezoelectric layer and approximately −2 times a piezoelectric coupling coefficient ($e_{33p}$) of the first piezoelectric layer, and the fourth piezoelectric layer has a piezoelectric coupling coefficient ($e_{33ip}$) in a range between approximately −0.1 times a piezoelectric coupling coefficient ($e_{33p}$) of the third piezoelectric layer and approximately −2 times a piezoelectric coupling coefficient ($e_{33p}$) of the third piezoelectric layer.

8. A RAW resonator structure as claimed in claim 6, wherein the first piezoelectric layer and the second piezoelectric layer each comprise the same piezoelectric material having substantially identical elastic properties.

9. A BAW resonator structure as claimed in claim 8, wherein the piezoelectric material comprises one of aluminum nitride (AlN) and Zinc Oxide (ZnO).

10. A BAW resonator structure as claimed in claim 9, further comprising an acoustic reflector disposed beneath the first electrode.

11. A BAW resonator structure as claimed in claim 10, wherein the acoustic reflector comprises a cavity.

12. A BAW resonator as claimed in claim 11, wherein an active region of the BAW resonator comprises an overlap of the first electrode, the second electrode and the third electrode with the cavity.

13. A BAW resonator as claimed in claim 12, wherein the second electrode overlaps the second and the fourth piezoelectric layer, and the third electrode overlaps the second and the fourth piezoelectric layer.

14. A BAW resonator as claimed in claim 5, further comprising: an acoustic coupling layer disposed between the second electrode and the second piezoelectric layer; and a fourth electrode disposed above the acoustic coupling layer and beneath the second piezoelectric layer.

15. A bulk acoustic wave (BAW) resonator structure, comprising:
a first electrode disposed over a substrate;
a cavity beneath the first electrode;
a first piezoelectric layer disposed over the first electrode, the first piezoelectric layer having a first c-axis oriented along a first direction;
a second electrode disposed over the first piezoelectric layer, wherein an active region of the BAW resonator structure comprises an overlap of the first electrode and the second electrode with the cavity; and
a second piezoelectric layer disposed over the first electrode and adjacent to the first piezoelectric layer, the second piezoelectric layer having a second c-axis oriented in a second direction that is substantially antiparallel to the first direction, wherein the second electrode overlaps the second piezoelectric layer.

16. A bulk acoustic wave (BAW) resonator structure, comprising:
a first electrode disposed over a substrate;
a first piezoelectric layer disposed over the first electrode, the first piezoelectric layer having a first c-axis oriented along a first direction;
a second electrode disposed over the first piezoelectric layer; and
a second piezoelectric layer disposed over the first electrode and adjacent to the first piezoelectric layer, the second piezoelectric layer having a second c-axis oriented in a second direction that is substantially antiparallel to the first direction, wherein the second piezoelectric layer has a piezoelectric coupling coefficient ($e_{33ip}$) in a range between approximately −0.1 times a piezoelectric coupling coefficient ($e_{33p}$) of the first piezoelectric layer and approximately −2 times a piezoelectric coupling coefficient ($e_{33p}$) of the first piezoelectric layer.

17. A BAW resonator structure as claimed in claim 6, wherein the second electrode does not overlap an edge of the cavity.

* * * * *